(12) United States Patent
Hong

(10) Patent No.: US 7,236,116 B2
(45) Date of Patent: Jun. 26, 2007

(54) RECONFIGURABLE SWITCHED-CAPACITOR INPUT CIRCUIT WITH DIGITAL-STIMULUS ACCEPTABILITY FOR ANALOG TESTS

(75) Inventor: Hao-Chiao Hong, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/369,826

(22) Filed: Mar. 8, 2006

(65) Prior Publication Data

US 2007/0063885 A1    Mar. 22, 2007

(30) Foreign Application Priority Data

Sep. 16, 2005    (TW) .............................. 94132003 A

(51) Int. Cl.
*H03M 1/66* (2006.01)
(52) U.S. Cl. ...................... 341/150; 341/120; 341/143; 341/172
(58) Field of Classification Search ................. 341/120
See application file for complete search history.

(56) References Cited

U.S. PATENT DOCUMENTS

| 5,132,685 | A | 7/1992 | DeWitt et al. |
| 5,305,003 | A | 4/1994 | Han |
| 5,659,312 | A | 8/1997 | Sunter et al. |
| 6,184,811 | B1 * | 2/2001 | Nagari et al. ............... 341/143 |
| 6,333,706 | B1 | 12/2001 | Cummings et al. |
| 6,917,324 | B2 * | 7/2005 | Lee ............................ 341/155 |
| 6,950,046 | B2 * | 9/2005 | Luo et al. ................... 341/120 |

OTHER PUBLICATIONS

M. Hafed and G.W. Roberts, "A stand-alone integrated excitation extraction system for analog BIST applications," in Proc.IEEE Custom Integrated Circuits Conf. (CICC), 2000, pp. 83-86.
F. Azais, S. Bernard, Y. Bertrand, and M. Renovell, "Implementation of a linear histogram BIST for ADCs," in Proc. IEEE European Test Workshop (ETW), 2000, pp. 129-134.
H.C. Hong, "Design-for-Digital-Testability 30MHz Second-order Modulator," in Proc. IEEE Custom IC Conference (CICC), 2004, pp. 211-214.

* cited by examiner

*Primary Examiner*—Khai M. Nguyen
(74) *Attorney, Agent, or Firm*—Rosenberg, Klein & Lee

(57) ABSTRACT

A reconfigurable switched-capacitor input circuit with digital-stimulus acceptability for analog tests disclosed in the present invention provides the digital input interfaces, which are comprised of capacitors, analog switches and digital circuits, for the usage of testing the mixed-signal circuits. The present invention provides a low-priced testing platform to accomplish the testing of circuits and to solve the problems of high-cost mixed mode tester and of utmost restrictions against the surrounding condition. Therefore, the present invention improves the testability, reduces the test cost, shorten the processes of designation and efficiently seize on the time-to-market.

49 Claims, 18 Drawing Sheets

US 7,236,116 B2

RECONFIGURABLE SWITCHED-CAPACITOR INPUT CIRCUIT WITH DIGITAL-STIMULUS ACCEPTABILITY FOR ANALOG TESTS

BACKGROUND OF THE INVENTION

1. Field of Invention

The invention is related to a reconfigurable switched-capacitor input circuit, and more particularly, to a reconfigurable switched-capacitor input circuit with digital-stimulus acceptability for testing mixed-signal circuits.

2. Description of the Related Art

At all electronics and electrical manufacturers focus on the family amusement market of meanwhile, makes the audio chip market growing up significantly. Hence, the test for a mixed-signal component that is comprised of the switched-capacitor circuits, such as the Sigma-Delta modulators, becomes more and more important. The evolution of the integrated circuit manufacture technology allows integrating diverse components such as digital, analog, and memory circuits on the same chip. The testability and high testing cost of such products become a sever issue due to the diversity of the test characteristics of the embedded circuits. And this issue is much more critical for the mixed-signal circuits since their tests traditionally have to rely on high-priced mixed-signal circuit testers like Aglient 94000. Also, on account of most testers that do not support testing the analog circuit and digital circuit simultaneously, a longer testing time is required and makes disadvantageous fluctuation factors in both of the cost and time-to-market of the products.

U.S. Pat. No. 5,132,685 titled as "Built-in self test for analog to digital converters" indicates that a ramp generator with a large area is exerted additionally and provides a ramp voltage to the A/D input, while a state machine monitors the output. Nevertheless, the testing accuracy depends on how accurate the ramp generator's output is and the generated ramp signal is not suitable for testing the circuits of either the Sigma-Delta modulator or the filter.

As for what disclosed in U.S. Pat. No. 5,305,003, "Test device of analog/digital converter" it is a digital circuit for testing the analog/digital converter only and fails to test the analog circuit.

In U.S. Pat. No. 5,659,312, it titles as "Method and apparatus for testing digital to analog and analog to digital converters" and reveals that a highly accurate built-in digital-to-analog converter with a large area is used as the stimulus source. In this invention, the testing accuracy depends on the accuracy of the built-in digital-to-analog converters exerted; that is, the digital-to-analog converter has to be verified by some means first. Consequently, higher cost for hardware and testing has to be endured.

A built-in self-test for analog to digital converter is mentioned in U.S. Pat. No. 6,333,706, a built-in random-waveform generator with a large area is applied in this invention. Still, the accuracy of test results depends on the accuracy of the built-in random-waveform generators employed. In addition to the higher hardware cost, the built-in random-waveform generator would not carry out the at-speed tests.

SUMMARY OF THE INVENTION

The primary objective of the present invention is to provide a reconfigurable switched-capacitor input circuit with digital-stimulus acceptability for testing mixed-signal circuits, which carries out the tests of mixed-signal circuits via digital stimulus signals, would reduce the test cost.

A further objective of the present invention is to share critical circuit elements during testing thus offers high testing accuracy, high fault-coverage and the capability of performing at-speed tests owning to the shared critical circuit elements having the same loads in both test and normal operation modes.

A still further objective of the present invention is to provide a particular-designed reconfigurable circuit, which would apply for all kinds of the mixed-signal circuit architectures, for accelerating the design process and shortening the time-to-market.

According to the present invention, these objectives are achieved by providing a reconfigurable switched-capacitor input circuit with digital-stimulus acceptability for testing mixed-signal circuits. The reconfigurable switched-capacitor input circuit includes an analog-input signal, a plurality of direct current voltage sources, an operational amplifier, at least two switched-capacitor sets as well as a digital switching-signal generator. The analog-input signal contains a positive phase voltage signal and a negative phase voltage signal. Those direct current voltage sources contain a first direct current voltage source, a second direct current voltage source, a third direct current voltage source, and a fourth direct current voltage source. The operational amplifier has a positive input end, a negative input end, a positive amplifier output end, and a negative amplifier output end; the operational amplifier amplifies the voltage bias of the positive and the negative input ends and produces an amplified output voltage between the positive and the negative amplifier output ends. Each of the switched-capacitor set consists of a first capacitor, a second capacitor and a plurality of analog-signal switches and every capacitor mentioned above has a bottom end and a top end. Moreover, every switched-capacitor set has a corresponding digital stimulus, which is a Sigma-Delta modulated bit-stream and has two logic states: an increased state and a decreased state. As for the signals received by the digital switching-signal generator, the digital mode signal has two logic states including a normal mode state and a test mode state; the clock signal is used to generate at least two non-overlapped clock phases including a first clock phase and a second clock phase. The digital switching-signal generator receives at least a digital mode signal, a clock signal, a plurality of the digital stimuli and generating a plurality of switching signals to control the analog-signal switches of the switched-capacitor sets. When the digital mode signal is in the test mode state, each of the switched-capacitor set behaves as a one-bit digital-to-charge converter with its corresponding digital stimulus as the digital input.

Over and above, those objectives also can be achieved by providing a reconfigurable switched-capacitor input circuit with digital-stimulus acceptability, which suits for a digitally testable architecture with a switched-capacitor input circuit. The reconfigurable switched-capacitor input circuit includes an analog-input signal, a plurality of direct current voltage sources, an operational amplifier, at least one switched-capacitor set as well as a digital switching-signal generator. The analog-input signal contains a positive phase voltage signal and a negative phase voltage signal. Those direct current voltage sources contain a first direct current voltage source, a second direct current voltage source, and a third direct current voltage source. The operational amplifier has a positive input end, a negative input end, a positive amplifier output end, and a negative amplifier output end; the operational amplifier amplifies the voltage bias of the positive and the negative input ends and produces an amplified output voltage between the positive and the negative amplifier output ends. Each of the switched-capacitor set consists of a first capacitor, a second capacitor and a plurality of analog-signal switches and every capacitor mentioned above has a bottom end and a top end. Moreover, every switched-capacitor set has a corresponding digital stimulus, which is a Sigma-Delta modulated bit-stream and has two logic states: an increased state and a decreased state. The digital switching-signal generator receives at least a digital mode signal, a clock signal, and a plurality of the digital stimuli and generates a plurality of switching signals to control the analog-signal switches of the switched-capacitor sets. As for the signals received by the digital switching-signal generator, the digital mode signal has two logic states including a normal mode state and a test mode state; the clock signal is used to generate at least two non-overlapped clock phases including a first clock phase and a second clock phase. When the digital mode signal is in the test mode state, each of the switched-capacitor set behaves as a one-bit digital-to-charge converter with its corresponding digital stimulus as the digital input.

Finally, there is still another architecture disclosed in this invention to achieve the objectives. A reconfigurable switched-capacitor input circuit with digital-stimulus acceptability for analog tests, which suits for a digitally testable architecture with a switched-capacitor input circuit. The reconfigurable switched-capacitor input circuit includes an analog-input signal, a digital-data signal, multiple direct current voltage sources, an operational amplifier, at least one switched-capacitor set as well as a digital switching-signal generator. The analog-input signal contains a positive phase voltage signal and a negative phase voltage signal while the digital-data signal has a subtraction logic state and an addition logic state. Those direct current voltage sources contain a first direct current voltage source, a second direct current voltage source and a third direct current voltage source. The operational amplifier has a positive input end, a negative input end, a positive amplifier output end, and a negative amplifier output end. The operational amplifier amplifies the voltage bias/difference of the positive and the negative input ends and produces an amplified output voltage between the positive and the negative amplifier output ends. Each of the switched-capacitor set consists of a first capacitor, a second capacitor and a plurality of analog-signal switches and every capacitor mentioned above has a bottom end and a top end. Moreover, every switched-capacitor set has a corresponding digital stimulus, which is a Sigma-Delta modulated bit-stream and has two logic states: an increased state and a decreased state. The digital switching-signal generator receives at least a digital mode signal, a clock signal, the digital-data signal, and a plurality of the digital stimuli and generates a plurality of switching signals to control the analog-signal switches of the switched-capacitor sets. As for the signals received by the digital switching-signal generator, the digital mode signal has two logic states including a normal mode state and a test mode state; the clock signal is used to generate at least two non-overlapped clock phases including a first clock phase and a second clock phase. When the digital mode signal is in the test mode state, each of the switched-capacitor set behaves as a one-bit digital-to-charge converter with its corresponding digital stimulus as the digital input. At the same time, each of the switched-capacitor set also preserves the effects of the digital-data as in the normal mode operation.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE INVENTION

The present invention, which exerts the switched-capacitor and switch circuits as a reconfigurable switched-capacitor input circuit to replace the original input network of the circuit under test for receiving the digital stimuli during the analog test process, reduces the test cost substantially.

The present invention is a brand-new digitally testable circuit, which is suitable for the applications with a switched-capacitor input circuit. Substituting the switched-capacitor input circuit of the circuit under test with this invention provides two operation modes through controlling the digital mode signal: the normal mode and test mode. In the normal mode, the additional design-for-testability circuits have no impact on the circuit under test; the circuit under test stays in the primordial operation.

Figure 1:
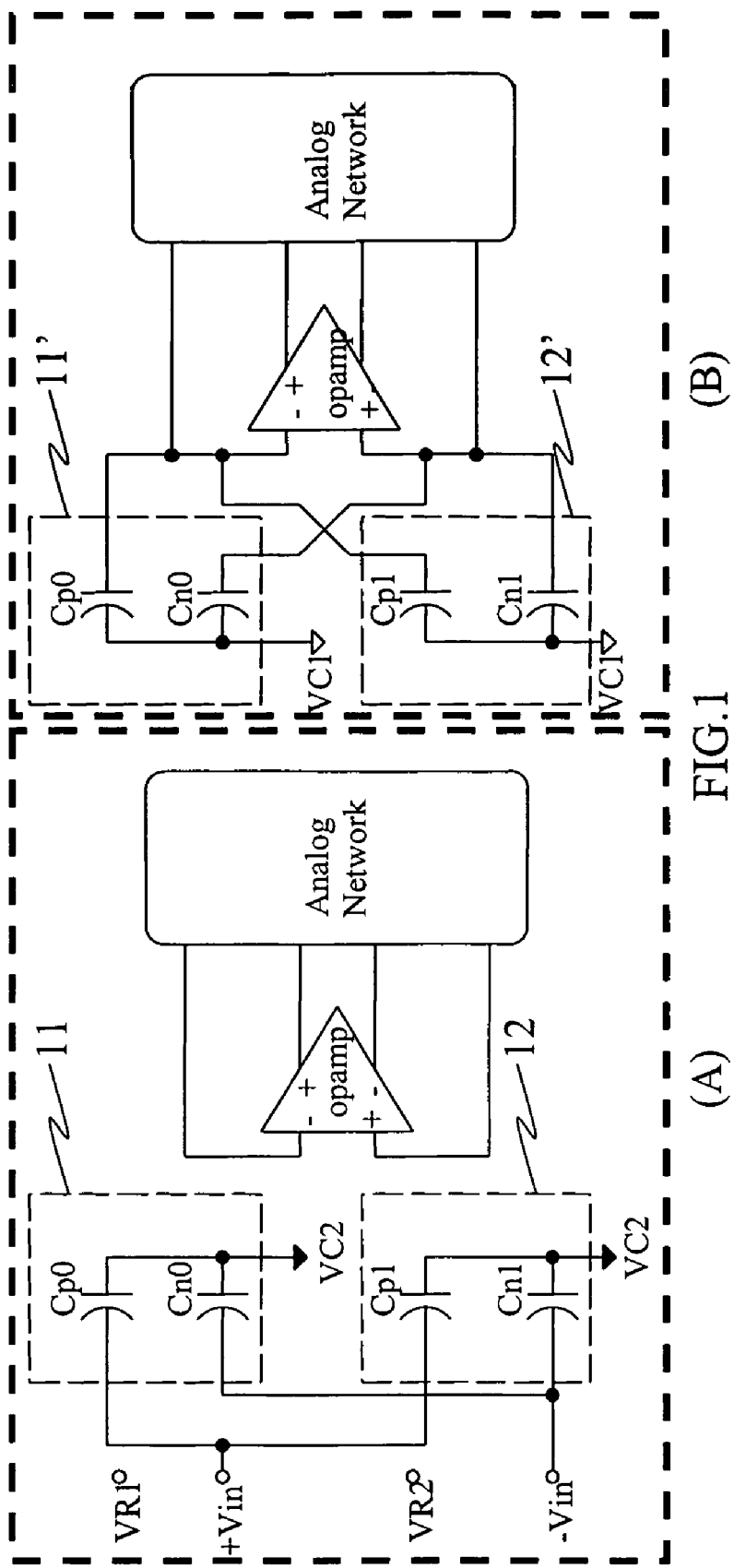
FIG. 1 depicts the operation of the reconfigurable switched-capacitor input circuit in the normal mode for the first and third embodiments of the present invention.

To better understand the operation of the reconfigurable switched-capacitor input circuit, the circuit connections in the two non-overlapped clock phases are described. FIG. 1 represents the operation of the reconfigurable switched-capacitor input circuit in the normal mode for the first embodiment of the present invention that exerts at least two switched-capacitor sets. FIG. 1(A) shows the circuit connections in the first clock phase. The digital switching-signal generator generates the switching signals to control the analog-signal switches of the switched-capacitor sets 11 and 12 so that the bottom ends of the first capacitors Cp0 and Cp1 of the switched-capacitor sets connect to the analog input positive phase voltage signal +Vin and the bottom ends of the second capacitors Cn0 and Cn1 of the switched-capacitor sets connect to the analog input negative phase voltage signal −Vin. And all the top ends of the capacitors Cp0, Cn0, Cp1 and Cn1 connect to the direct current voltage source VC2. The circuit connections in the second clock phase in the normal mode are shown in FIG. 1(B). All the bottom ends of the capacitors Cp0, Cn0, Cp1 and Cn1 of the switched-capacitor sets 11' and 12' connect to the direct current voltage source VC1; meanwhile, the top ends of the first capacitors Cp0 and Cp1 connect to the negative input end of the operational amplifier (opamp) and the top ends of the second capacitors Cn0 and Cn1 connect to a positive input end of the operational amplifier.

Figure 2:
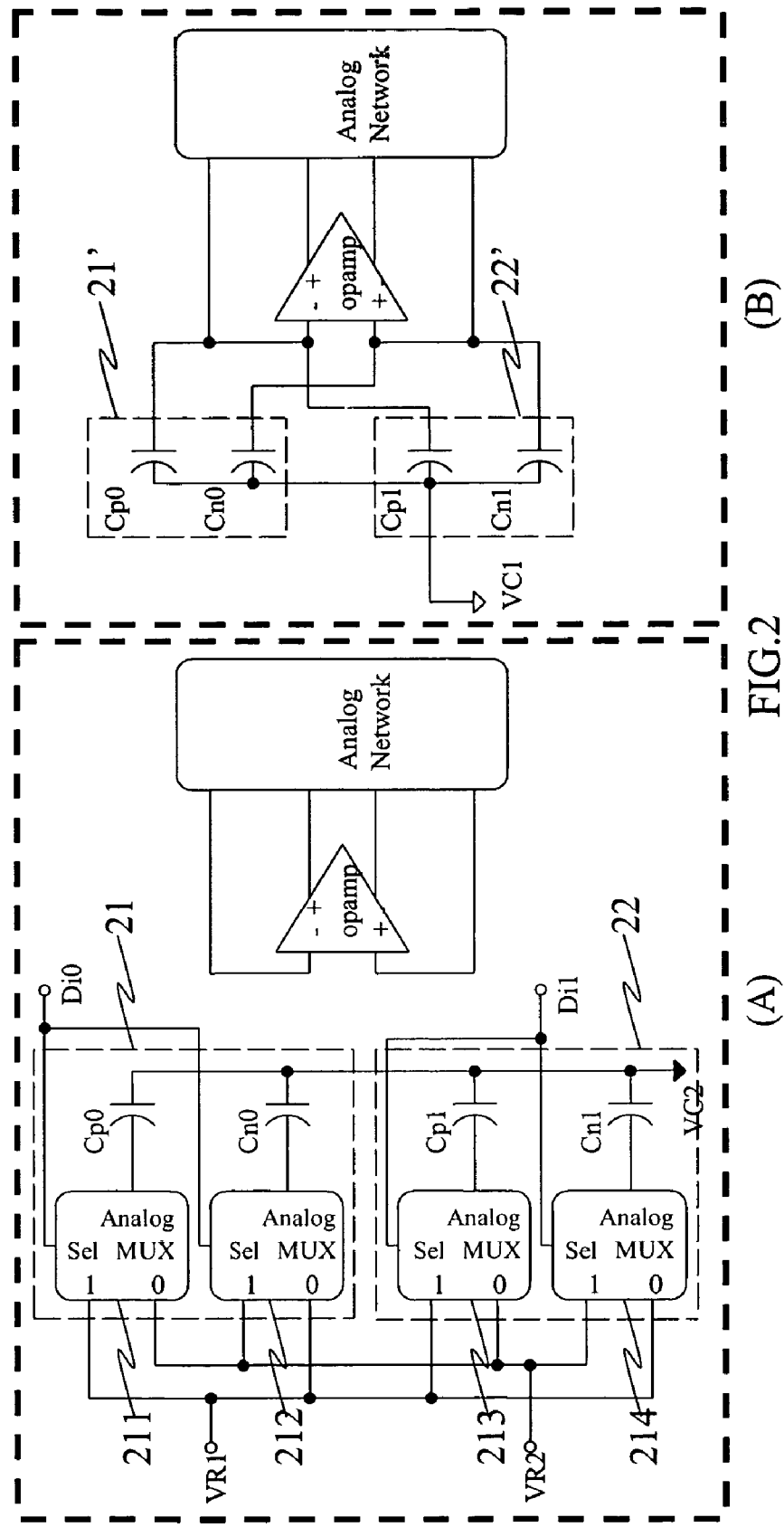
FIG. 2 depicts the operation of the reconfigurable switched-capacitor input circuit in the test mode for the first and the second embodiments of the present invention.

Furthermore, FIG. 2 represents the operation in the test mode of the first embodiment of the present invention, wherein FIG. 2(A) and FIG. 2(B) illustrate the circuit connections in the two non-overlapped clock phases respectively. FIG. 2(A) shows the connections of the circuits in the first clock phase in the test mode. The conceptual analog multiplexers 211 and 212 are made up of the analog-signal switches of the switched-capacitor set 21 and accompanied with the capacitors within the switched-capacitor set 21 as well as the conceptual analog multipiexers 213 and 214 are parts of the switched-capacitor set 22 and accompanied with the capacitors within the switched-capacitor set 22. The top ends of the capacitors Cp0, Cn0, Cp1 and Cn1 of the switched-capacitor sets 21 and 22 connect to the direct current voltage source VC2. The digital switching-signal generator receives a digital stimulus Di0 and depends on its logic state to generate the switching signals to control the conceptual analog multiplexers 211 and 212 as well as the analog-signal switches of the switched-capacitor set 21; the digital switching-signal generator also receives a digital stimulus Di1 to control the conceptual analog multiplexers 213 and 214. And then, the connection states of the accompanied switched-capacitor sets 21 and 22 are determined in an "increased state" or a "decrease state" depending on their corresponding digital stimuli. The "increased state" of a switched capacitor set is defined if the bottom end of the first capacitor Cp0 or Cp1 within the switched-capacitor set is switched to connect to the direct current voltage source VR1 and the bottom end of the second capacitor Cn0 or Cn1 within the same switched-capacitor set connects to the direct current voltage source VR2. On the other hand, the switched-capacitor set is in its "decreased state" if the bottom end of the first capacitor within the switched-capacitor set connects to the direct current voltage source VR2 as well as the bottom end of the second capacitor within the same switched-capacitor set connects to the direct current voltage source VR1.

The digital stimuli Di1 and Di0 are the Sigma-Delta modulated digital stimulus bit-streams. The difference between the digital stimulus Di1 and the digital stimulus Di0 is that the digital stimulus Di1 is delayed by at least one period comparing to the digital stimulus Di0.

Referring to FIG. 2(B), the circuit connections in the second clock phase in the test mode are indicated. All the bottom ends of capacitors Cp0, Cn0, Cp1 and Cn1 inside the switched-capacitor sets 21' and 22' connect to the direct current voltage source VC1 controlled by the switching signals generated from the digital switching-signal generator. Also, the top ends of the first capacitors Cp0 and Cp1 within the switched-capacitor sets 21' and 22' connect to the negative input end of the operational amplifier and the top ends of the second capacitors Cn0 and Cn1 within the switched-capacitor sets 21' and 22' connect to the positive input end of the operational amplifier.

Figure 3:
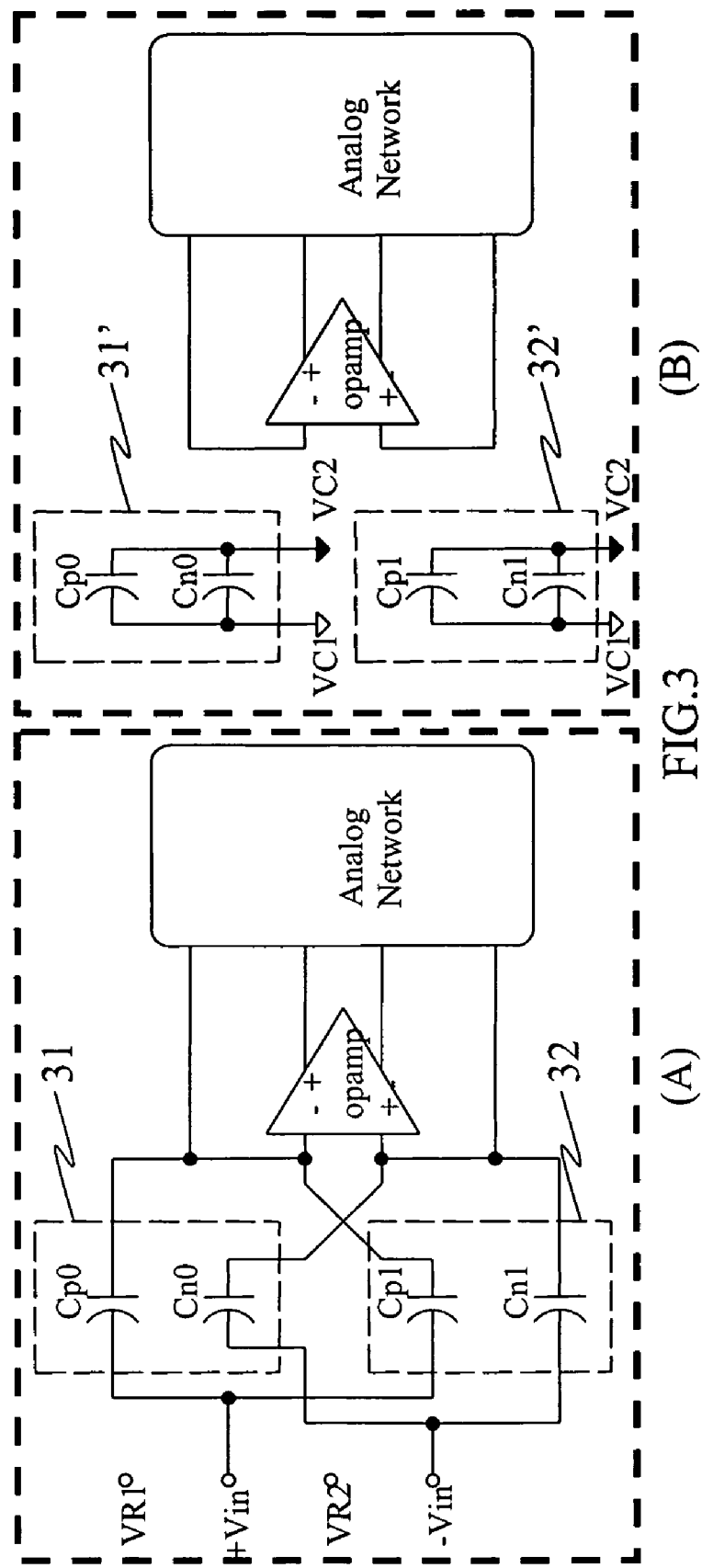
FIG. 3 depicts the operation of the reconfigurable switched-capacitor input circuit in the normal mode for the second and the fourth embodiments of the present invention.

Actually, the operation of the input circuit of the circuit under test in the normal mode is not limited by that revealed in FIG. 1. The second embodiment with regard to the reconfigurable switched-capacitor input circuit in the normal mode is introduced in FIG. 3, wherein FIG. 3(A) and FIG. 3(B) represent the circuit connections in the two non-overlapped clock phases respectively. The circuit connections of the input circuit in the first clock phase are provided in FIG. 3(A). The digital switching-signal generator generates the switching signals to connect the analog input positive phase voltage signal +Vin to the bottom ends of the first capacitors Cp0 and Cp1 of the switched-capacitor sets 31 and 32 and, in the meantime, to connect the analog input negative phase voltage signal −Vin to the bottom ends of the second capacitors Cn0 and Cn1 of the switched-capacitor sets 31 and 32. The top ends of the first capacitors of the switched-capacitor sets are connected to the negative input end of the operational amplifier and the top ends of the second capacitors of the switched-capacitor sets are connected to the positive input end of the same operational amplifier. In FIG. 3(B), the circuit connections in the second clock phase are shown. All the bottom ends of the switched-capacitor sets 31' and 32' connect to the direct current voltage source VC1 and all the top ends of the switched-capacitor sets 31' and 32' connect to the direct current voltage source VC2.

Besides, the test mode operation in the two non-overlapped clock phases of the second embodiment whose normal mode operation is disclosed in FIG. 3 is the same as what mentioned in FIG. 2.

Figure 4:
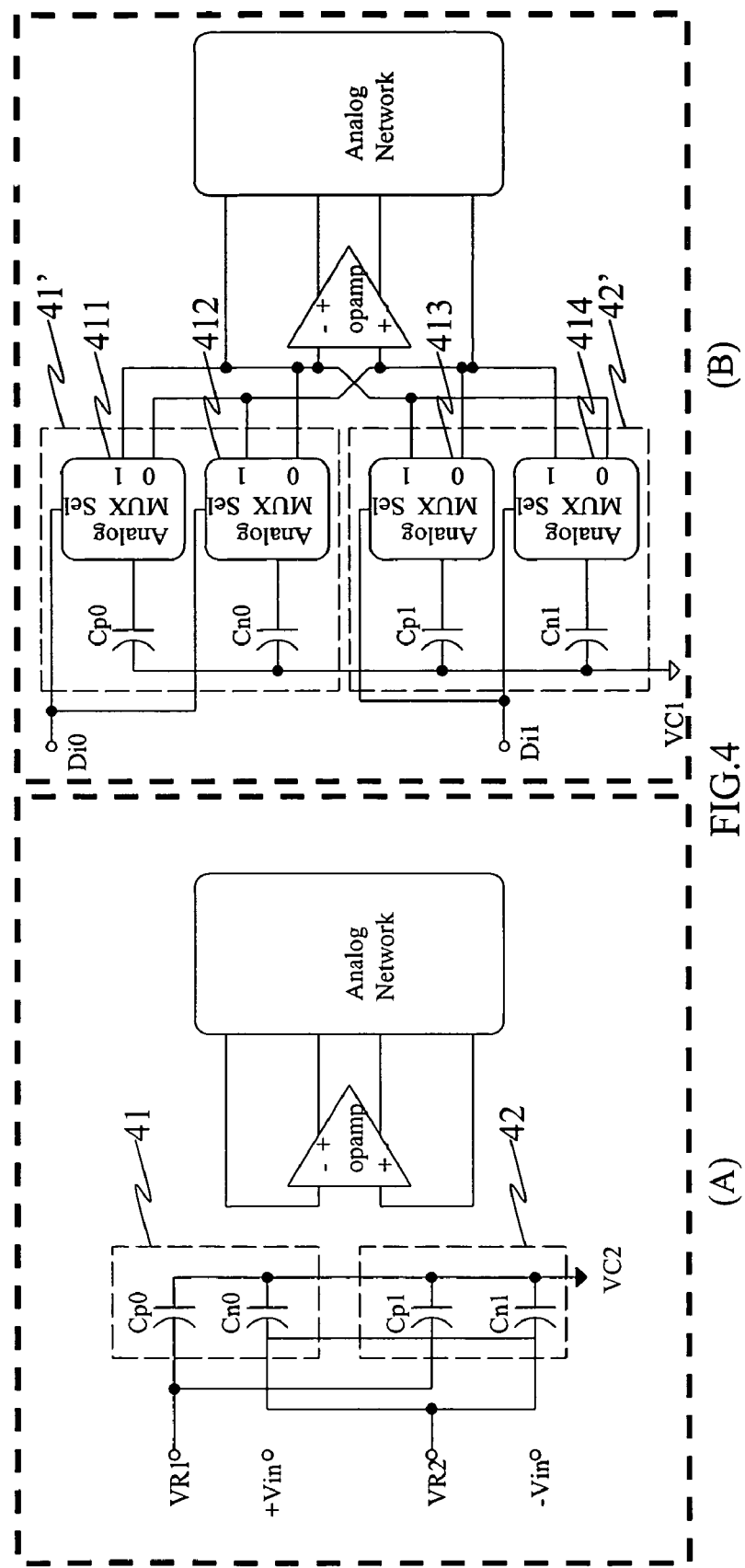
FIG. 4 depicts the operation of the reconfigurable switched-capacitor input circuit in the test mode for the third and the fourth embodiments of the present invention.

Additionally, the test mode operation of a third embodiment of this invention whose normal mode operation is described in FIG. 1 is unfolded in FIG. 4. Similar to the disclosure in FIG. 2, the circuit connections in the two non-overlapped clock phases in the test mode are shown in FIG. 4(A) and FIG. 4(B) respectively. In the first clock phase, the digital switching-signal generator generates the switching signals to control the analog-signal switches of the switched-capacitor sets 41 and 42 to make the top ends of the capacitors Cp0, Cn0, Cp1 and Cn1 inside the switched-capacitor sets 41 and 42 connecting to the direct current voltage source VC2 as illustrated in FIG. 4(A). At the same time, the bottom ends of the first capacitors Cp0 and Cp1 and the second capacitors Cn0 and Cn1 inside the switched-capacitor sets 41 and 42 are connected to the direct current voltage source VR1 and the direct current voltage source VR2 respectively. One part of what illustrated in FIG. 4(B) is that all the bottom ends of all the capacitors Cp0, Cn0, Cp1 and Cn1 inside the switched-capacitor sets 41' and 42' are switched to connect to the direct current voltage source VC1 in the second clock phase via the control of the switching signals from the digital switching-signal generator. Meanwhile, the digital switching-signal generator receives the digital stimuli Di0 and Di1 to generate corresponding switching signals to control the corresponding conceptual analog multiplexers 411, 412, 413 and 414 which are parts of the switched-capacitor sets 41' and 42' and to individually switch the switched-capacitor sets 41' and 42' to their "increased state" or the "decreased state". When the top end of the first capacitor inside the switched-capacitor set connects to the negative input end of the operational amplifier as well as the top end of the second capacitor inside the same switched-capacitor set connects to the positive input end of the operational amplifier, the switched-capacitor set is defined in its "increased state". If the top end of the first capacitor inside the switched-capacitor set connects to the positive input end of the operational amplifier as well as the top end of the second capacitor inside the same switched-capacitor set connects to the negative input end of the operational amplifier, the switched-capacitor set is defined in its "decreased state". The digital stimuli Di1 and Di0 are the Sigma-Delta modulated digital stimulus bit-streams and the sole difference between the digital stimulus Di1 and the digital stimulus Di0 is at least one period delayed for the former one comparing to the later one.

The operation of the input circuit in the normal mode of a fourth embodiment is disclosed in detail by FIG. 3. The test mode operation of the fourth embodiment is the same as mentioned in FIG. 4.

Among the four embodiments provided above, the relationship of the two non-overlapped clock phases of both the normal and test modes may be the combinations of the one-to-one correspondent, of the first clock phase in the normal mode corresponding to the second clock phase in the test mode and of the second clock phase in the normal mode corresponding to the first clock phase in the test mode. The switched-capacitor sets mentioned may share several analog-signal switches. The direct current voltage source VC1 may be the direct current voltage source VR1 or the direct current voltage source VR2; the direct current voltage source VC2 may be the direct current voltage source VC1, the direct current voltage source VR1, or the direct current voltage source VR2. The "increased state" of the digital stimulus Di0 may be corresponding to the "decreased state" of the digital stimulus Di1 while the "decreased state" of the digital stimulus Di0 may be corresponding to the "increased state" of the digital stimulus Di1.

Figure 5:
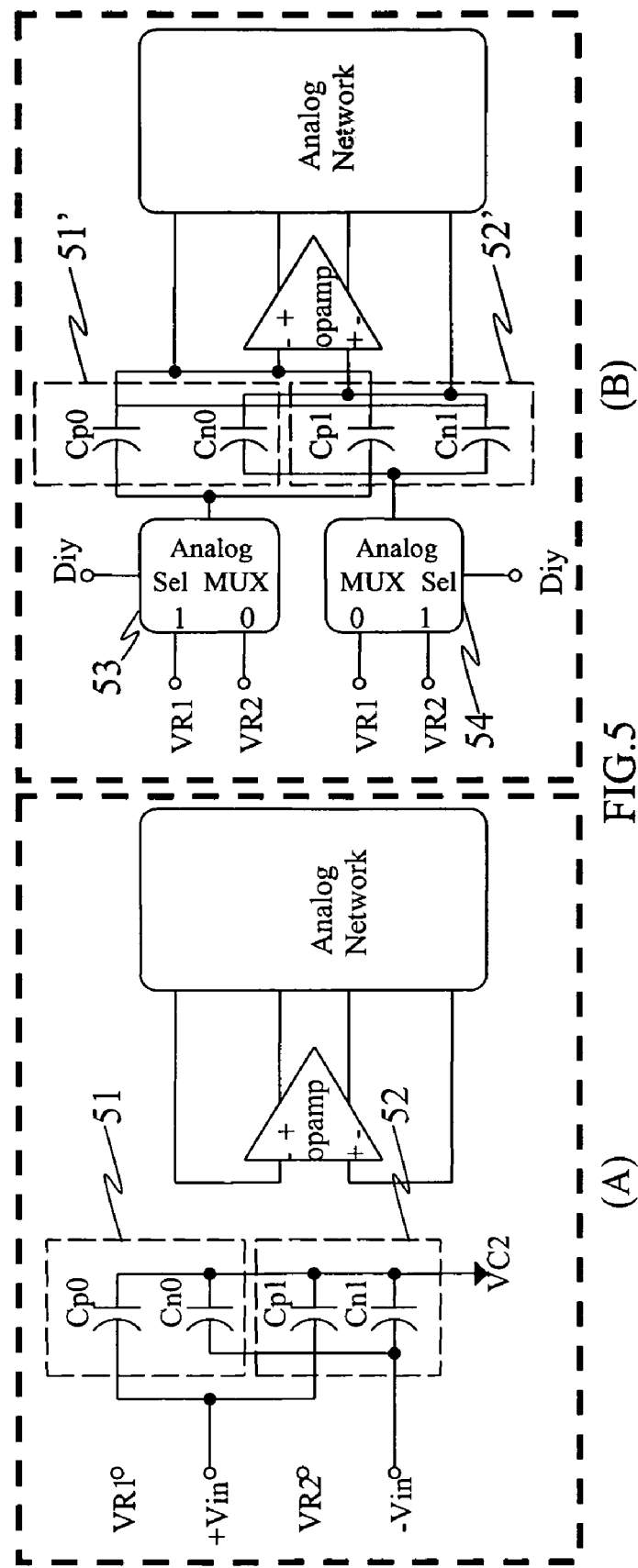
FIG. 5 depicts the operation of the reconfigurable switched-capacitor input circuit in the normal mode of the fifth embodiment of the present invention.

In FIG. 5, a fifth embodiment that includes at least two switched-capacitor sets is disclosed. Still, there are at least two non-overlapped clock phases under the normal mode operation as illustrated in FIG. 5(A) and FIG. 5(B). In the first clock phase, the circuit connections of the reconfigurable switched-capacitor input circuit in the normal mode, which are controlled by the digital switching-signals, are shown in FIG. 5(A). The bottom ends of the first capacitors Cp0 and Cp1 of the switched-capacitor sets 51 and 52 are switched to connect to the analog input positive phase voltage signal +Vin; the bottom ends of the second capacitors Cn0 and Cn1 of the switched-capacitor sets 51 and 52 are switched to connect to the analog input negative phase voltage signal −Vin. The top ends of all the capacitors Cp0, Cn0, Cp1 and Cn1 of the switched-capacitor sets 51 and 52 are connected to the direct current voltage source VC2. Referring to FIG. 5(B), the circuit connections in the second clock phase in the normal mode are the top ends of the first capacitors Cp0 and Cp1 of the switched-capacitor sets 51' and 52' connect to the negative input end of the operational amplifier; the top ends of the second capacitors Cn0 and Cn1 of the switched-capacitor sets 51' and 52' connect to the positive input end of the operational amplifier. According to the logic state of the digital-data signal Diy received, the digital switching-signal generator generates switching signals to control the switched-capacitor sets 51' and 52' being in a "subtraction state" or an "addition state". The circuit connections of the "subtraction state" are those the bottom ends of the first capacitors of the switched-capacitor sets 51' and 52' connect to the direct current voltage source VR1 while the bottom ends of the second capacitors of the switched-capacitor sets 51' and 52' connect to the direct current voltage source VR2. On the other hand, the circuit connections of the "addition state" are those the bottom ends of the first capacitors of the switched-capacitor sets 51' and 52' connect to the direct current voltage source VR2 while the bottom ends of the second capacitors of the switched-capacitor sets 51' and 52' connect to the direct current voltage source VR1.

Figure 6:
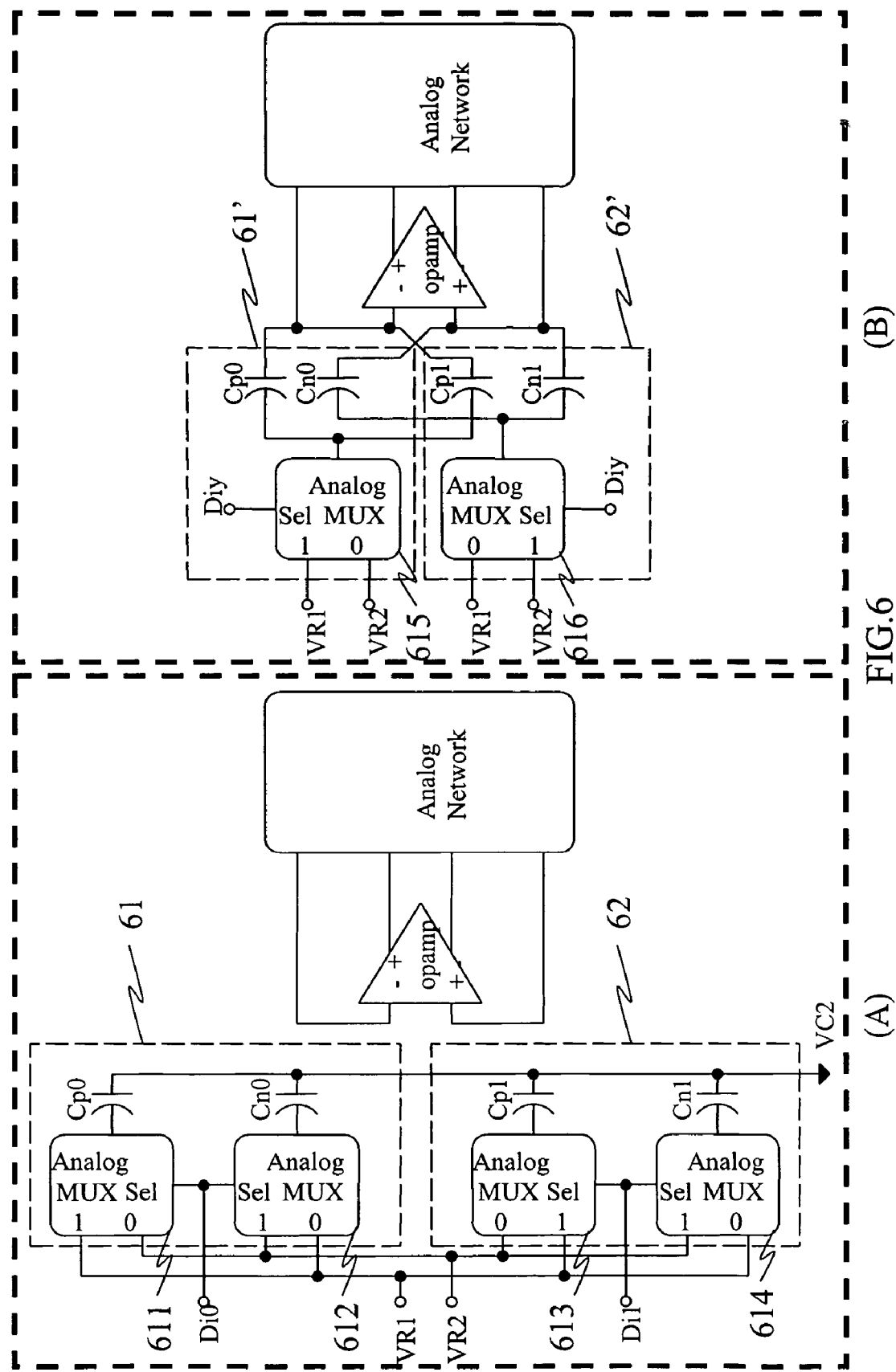
FIG. 6 depicts the operation of the reconfigurable switched-capacitor input circuit in the test mode of the fifth embodiment of the present invention.

In the basis of the embodiment in FIG. 5, the reconfigurable switched-capacitor input circuit operates in the test mode through controlling the digital mode signal. The test mode operation in the two non-overlapped clock phases are illustrated by FIG. 6(A) and FIG. 6(B) respectively. In the first clock phase, the digital switching-signal generator generates the switching signals to control the conceptual analog multiplexers 611 and 612 those are parts of the switched-capacitor set 61 so that the switched-capacitor set is in an "increased state" or a "decreased state" depending on the digital stimulus Di0. Similarly, the digital switching-signal generator generates the switching signals to control the conceptual analog multiplexers 613 and 614 inside the switched-capacitor set 62 so that the switched-capacitor set 62 is in the "increased state" or the "decreased state" depending on the digital stimulus Di1. The circuit connections of the "increased state" are those the bottom end of the first capacitor of the switched-capacitor set connects to the direct current voltage source VR1 while the bottom end of the second capacitor of the same switched-capacitor set 61 or 62 connects to the direct current voltage source VR2. Oppositely, the circuit connections of the "decreased state" are those the bottom end of the first capacitor of the switched-capacitor set connects to the direct current voltage source VR2 while the bottom end of the second capacitor of the same switched-capacitor set connects to the direct current voltage source VR1. All top ends of the capacitors in the switched-capacitor sets are connected to the direct current voltage source VC2 in the first clock phase in the test mode.

The circuit connections in the second clock phase in the test mode are illustrated in FIG. 6(B). The top ends of the first capacitors Cp0 and Cp1 of the switched-capacitor sets 61' and 62' are connected to the negative input end of the operational amplifier while the top ends of the second capacitors Cn0 and Cn1 of the switched-capacitor sets 61' and 62' are connected to the positive input end of the operational amplifier. Moreover, depending on the logic state of the digital-data signal Diy received, the digital switching-signal generator generates switching signals to control the analog-signal switches as well as the conceptual analog multiplexers 615 and 616 and in the switched-capacitor sets 61' and 62' so that the switched-capacitor sets 61' and 62' are in a "subtraction state" or an "addition state". The circuit connections of the "subtraction state" are those the bottom ends of the first capacitors of the switched-capacitor sets 61' and 62' connect to the direct current voltage source VR1 while the bottom ends of the second capacitors of the switched-capacitor sets 61' and 62' connect to the direct current voltage source VR2. The circuit connections of the "addition state" are those the bottom ends of the first capacitors of the switched-capacitor sets 61' and 62' connect to the direct current voltage source VR2 while the bottom ends of the second capacitors of the switched-capacitor sets 61' and 62' connect to the direct current voltage source VR1. The digital stimuli Di1 and Di0 are the Sigma-Delta modulated digital stimulus bit-streams and the sole difference between the digital stimulus Di1 and the digital stimulus Di0 is at least one period delayed for the former one comparing to the later one.

Furthermore, in the fifth embodiment, the "subtraction state" in the normal mode may be corresponding to the "addition state" in the test mode and vice versa. Similarly, the above-mentioned "increased state" controlled by the digital stimulus Di1 may correspond to the above-mentioned "decreased state" controlled by the digital stimulus Di0 and vice versa. Also, at least one analog-signal switch may be shared by the switched-capacitor sets. VC2 can be either VR1 or VR2.

Figure 7:
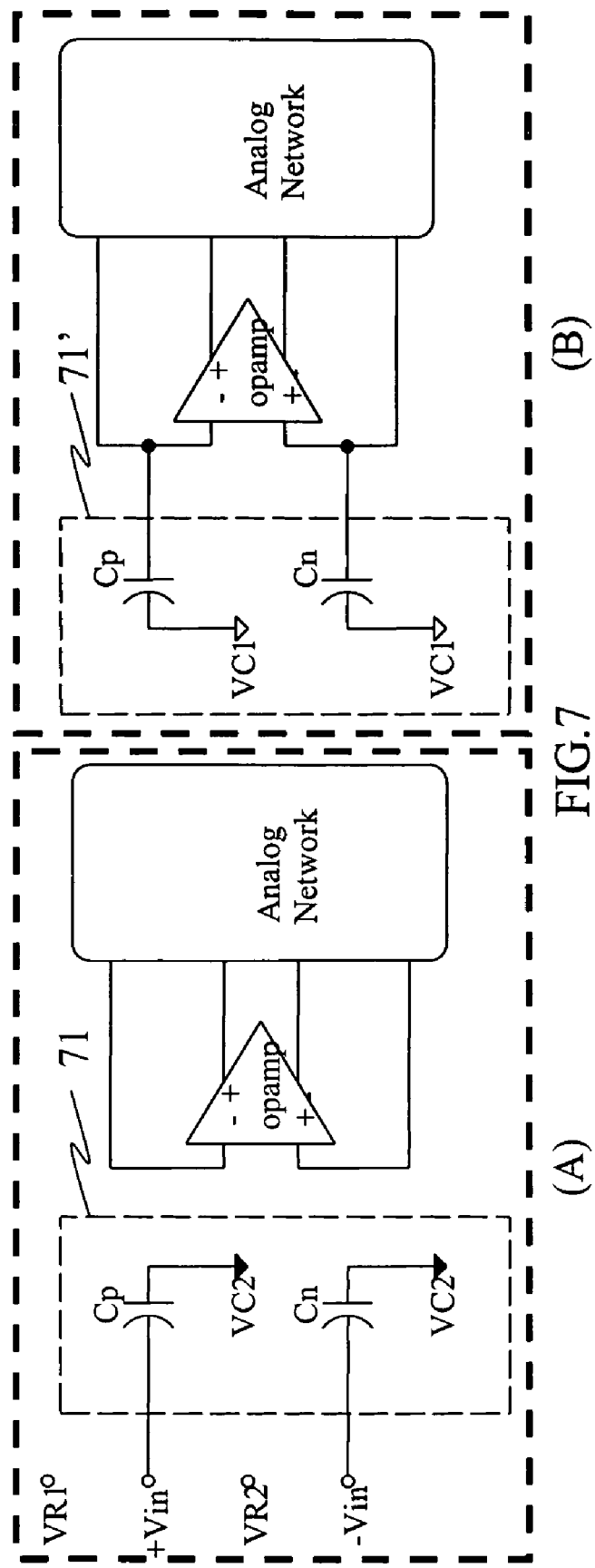
FIG. 7 depicts the operation of the reconfigurable switched-capacitor input circuit in the normal mode of the sixth and the eighth embodiments of the present invention.

Referring to FIG. 7, the normal mode operation of a sixth embodiment of the present invention that contains at least one switched-capacitor set is disclosed. The circuit connections in the two non-overlapped clock phases are illustrated in FIG. 7(A) and FIG. 7(B). In FIG. 7(A), the circuit connections of the switched-capacitor set 71 in the first clock phase are revealed. The digital switching-signal generator generates switching signals to control at least a switched-Capacitor set. The bottom end of the first capacitor Cp of the switched-capacitor set 71 is switched to connect to an analog input positive phase voltage signal +Vin; at the same time, the bottom end of the second capacitor Cn of the same switched-capacitor set is switched to connect to an analog input negative phase voltage signal −Vin. And the top ends of both capacitors Cp and Cn are connected to the direct current voltage source VC2. In FIG. 7(B), the circuit connections of the switched-capacitor set 71' in the second clock phase in the normal mode are provided. The digital switching-signal generator generates the switching signals to control the bottom ends of the capacitors Cp and Cn in the switched-capacitor set 71' connecting to the direct current voltage source VC1. Meanwhile, the top ends of the capacitors Cp and Cn are connected to the negative input end and the positive input end of the operational amplifier respectively.

Figure 8:
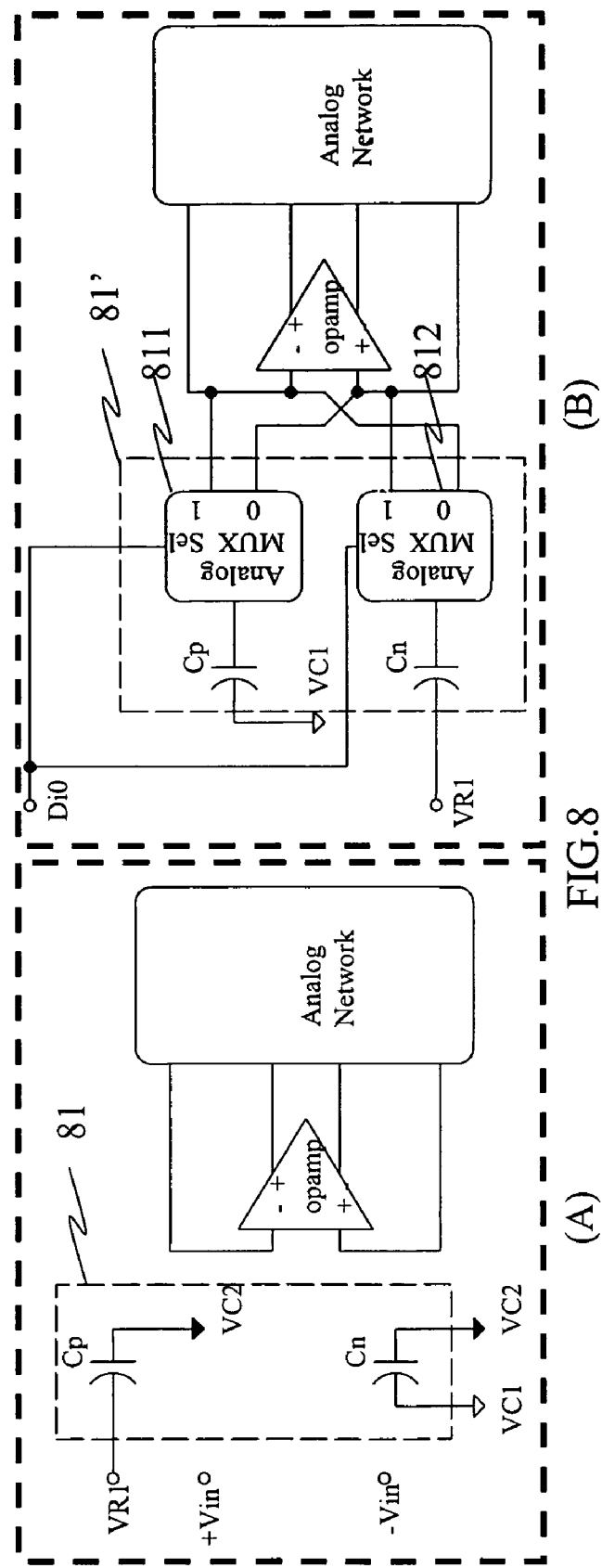
FIG. 8 depicts the operation of the reconfigurable switched-capacitor input circuit in the test mode of the sixth and the seventh embodiments of the present invention.

In FIG. 8, the test mode operation of the sixth embodiment of the present invention is provided. Still, at least two non-overlapped clock phases are included in the test mode and the circuit connections are illustrated in FIG. 8(A) and FIG. 8(B). The circuit connections of the switched-capacitor set 81 in the first clock phase in the test mode are shown in FIG. 8(A). The digital switching-signal generator generates switching signals to make the direct current voltage sources VR1 and VC1 respectively connecting to the bottom ends of the capacitors Cp and Cn of the switched-capacitor set 81. At the same time, the top ends of the capacitors Cp and Cn are all connected to the direct current voltage source VC2. In FIG. 8(B), the circuit connections in the second clock phase in the test mode are provided. The digital switching-signal generator generates associated switching signals to control the analog-signal switches as well as the conceptual analog multiplexers 811 and 812 inside the switched-capacitor set 81' so that the bottom end of the first capacitor Cp connects to the direct current voltage source VC1 and the bottom end of the second capacitor Cn connect to the direct current voltage source VR1. Depending on the logic state of the digital stimulus Di0 received by the digital switching-signal generator, the corresponding switched-capacitor set 81' is in an "increased state" or a "decreased state". The circuit connections of the "increased state" are those the top end of the first capacitor Cp connects to the negative input end of the operational amplifier and the top end of the second capacitor Cn connects to the positive input end of the operational amplifier; the circuit connections of the "decreased state" are those the top end of the first capacitor Cp connects to the positive input end of the operational amplifier and the top end of the second capacitor Cn connects to the negative input end of the operational amplifier.

Figure 9:
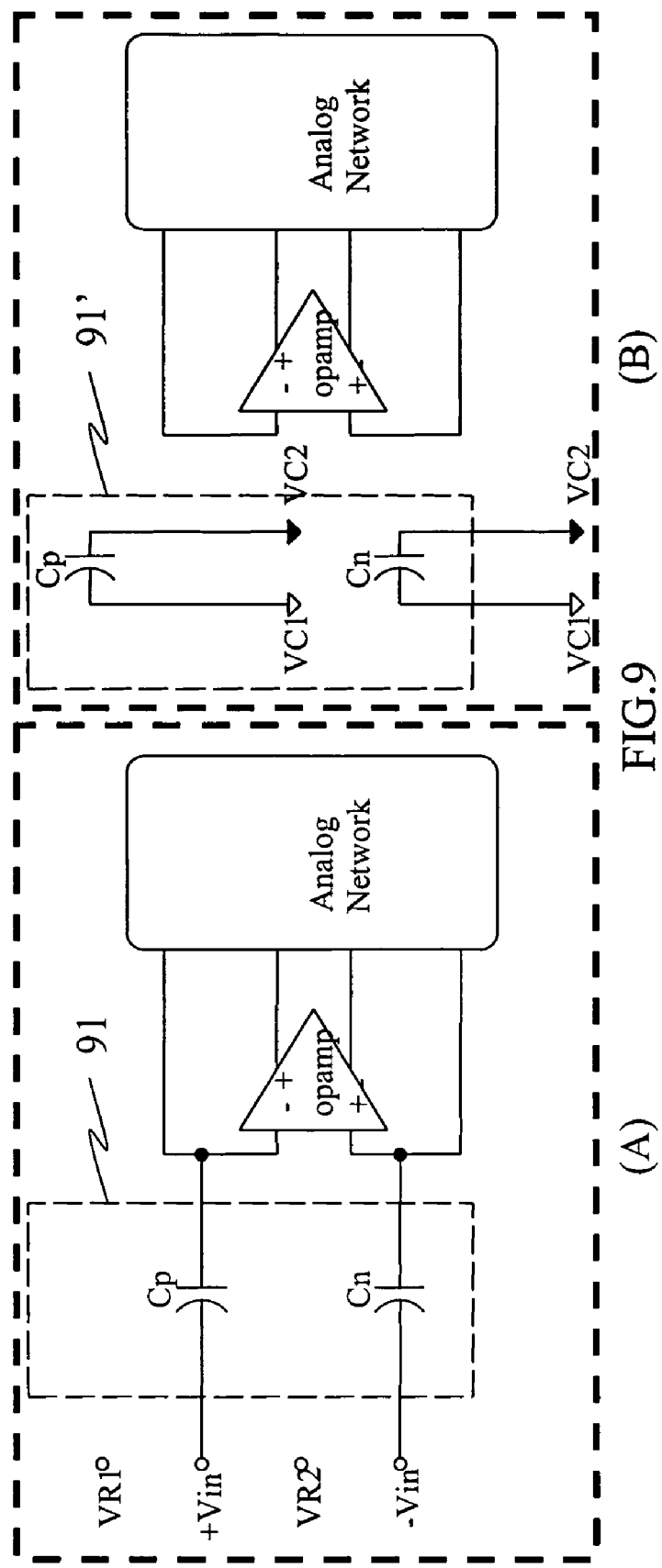
FIG. 9 depicts the operation of the reconfigurable switched-capacitor input circuit in the normal mode of the seventh and the ninth embodiments of the present invention.

Referring to FIG. 9, the normal mode operation of the seventh embodiment of the present invention is shown. In FIG. 9(A), the circuit connections in the first clock phase are illustrated. The digital switching-signal generator generates switching signals to control the switched-capacitor set 91 such that the bottom ends of the capacitors Cp and Cn of the switched-capacitor set 91 connect to the analog input positive and negative voltage signals +Vin and −Vin respectively. At the same time, the top ends of the capacitors Cp and Cn connect to the negative and the positive input ends of the operational amplifier respectively. In FIG. 9(B), the circuit connections in the second clock phase are provided. The digital switching signals control the analog-signal switches in the switched-capacitor set 91' so that the bottom ends of the capacitors Cp and Cn are connect to the direct current voltage source VC1 while the top ends of the capacitors Cp and Cn connect to the direct current voltage source VC2.

Moreover, the test mode operation of the seventh embodiment is illustrated in FIG. 8.

As for the eighth embodiment that contains at least a switched-capacitor set, its circuit connections in the two non-overlapped clock phases operating in the normal mode are the same as shown in FIG. 7.

Figure 10:
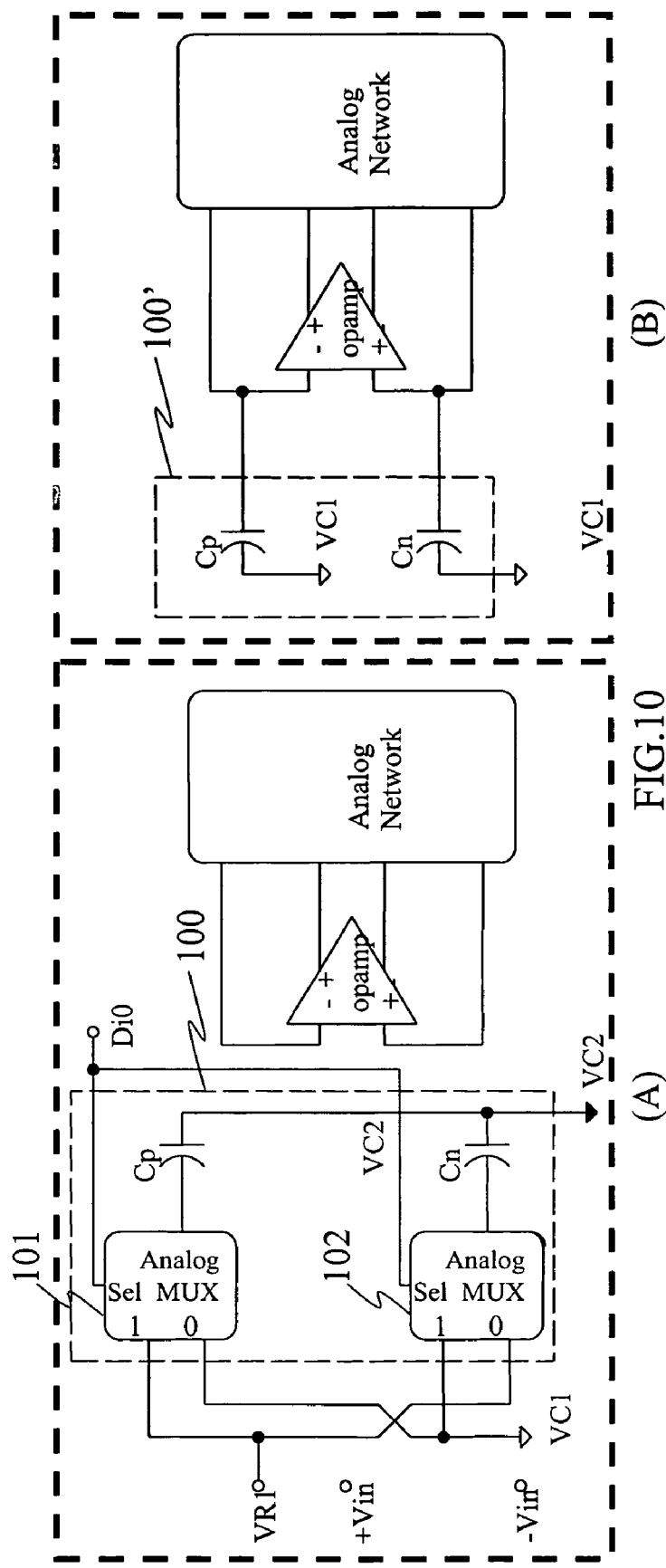
FIG. 10 depicts the operation of the reconfigurable switched-capacitor input circuit in the test mode of the eighth and the ninth embodiments of the present invention.

The test mode operation of the eighth embodiment is shown in FIG. 10. In FIG. 10(A), the circuit connections in the first clock phase are shown. The top ends of the capacitors in the switched-capacitor set connect to the direct current voltage source VC2. The switching-signal generator receives the corresponding digital stimulus Di0 of the switched-capacitor set and generates corresponding switching signals to control the analog-signal switches as well as the conceptual analog multiplexers 101 and 102 inside the switched-capacitor set 100 to decide the switched-capacitor set to be in an "increased state" or a "decreased state". In the "increased state" the bottom end of the first capacitor Cp connects to the direct current voltage source VR1 while the bottom end of the second capacitor Cn connects to the direct current voltage source VC1. In the "decreased state" the bottom end of the first capacitor connects to the direct current voltage source VC1 while the bottom end of the second capacitor connects to the direct current voltage source VR1. In FIG. 10(B), the circuit connections in the second clock phase in the test mode are provided. The bottom ends of the capacitors Cp and Cn connect to the direct current voltage source VC1 and the top ends of the capacitors Cp and Cn respectively connect to the negative input end and the positive input end of the operational amplifier.

The normal mode operation of the ninth embodiment of the present invention is illustrated in FIG. 9. The circuit connections in the two non-overlapped clock phases in the test mode of the ninth embodiment of the present invention are as illustrated in FIG. 10.

Among the sixth, seventh, eighth and ninth embodiments provided above, one of the relationships of the two non-overlapped clock phases in both normal and test modes can be one-to-one correspondent. Also, the relationships of the first clock phase in the normal mode corresponding to the second clock phase in the test mode and the second clock phase in the normal mode corresponding to the first clock phase in the test mode are both allowable. Besides, if there are more than one switched-capacitor sets, the switched-capacitor sets are able to share at least one analog-signal switch. The direct current voltage source VC2 can be the same as either the direct current voltage source VR1 or the direct current voltage source VC1.

Figure 11:
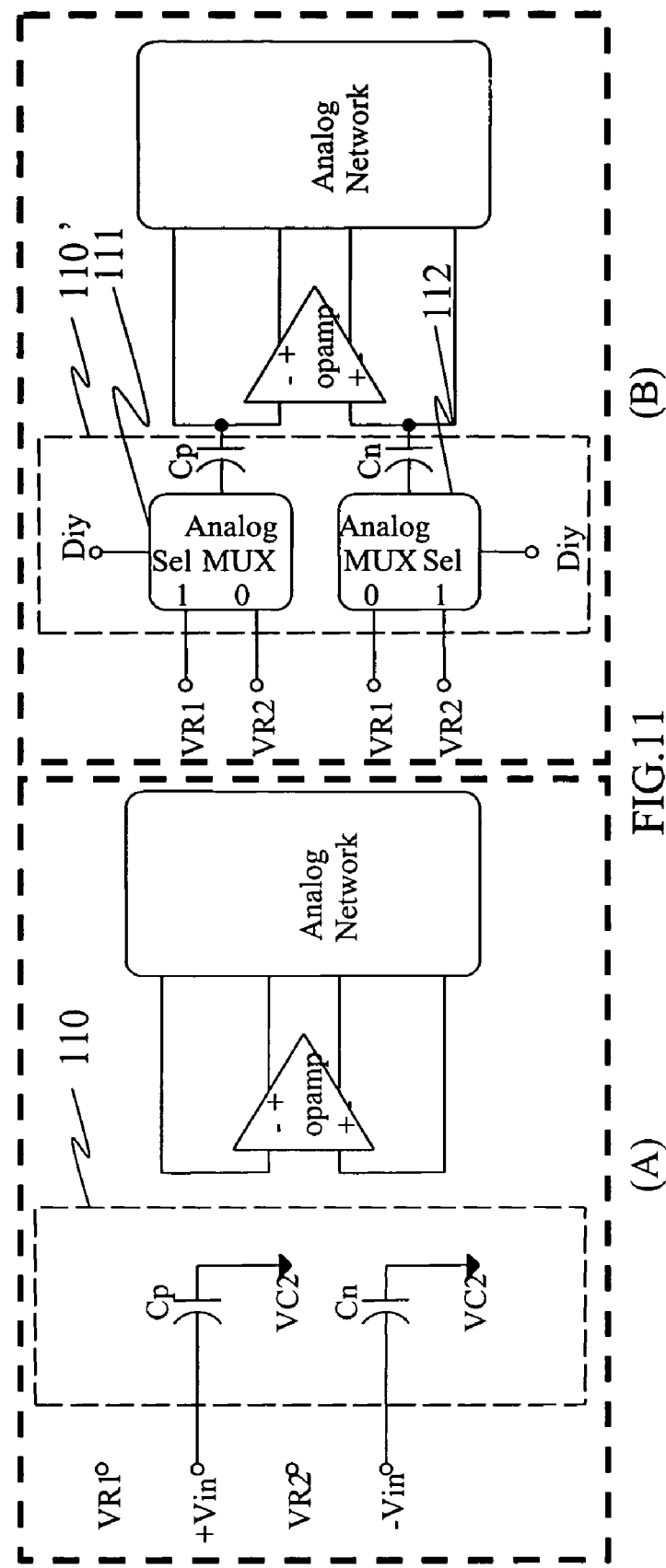
FIG. 11 depicts the operation of the reconfigurable switched-capacitor input circuit in the normal mode of the tenth embodiment of the present invention.

In FIG. 11, the normal mode operation of the tenth embodiment is provided. The tenth embodiment contains at least a switched-capacitor set. The circuit connections in the first clock phase are shown in FIG. 11(A). In the first clock phase, the bottom ends of the capacitors Cp and Cn of the switched-capacitor set 110 connect respectively to the analog input positive voltage signal +Vin and the analog input negative voltage signal −Vin. At the same time, the top ends of the capacitors Cp and Cn connect to the direct current voltage source VC2. Referring to circuit connections in the second clock phase illustrated in FIG. 11(B), the top end of the first capacitor Cp connects to the negative input end of the operational amplifier; the top end of the second capacitor Cn connects to the positive input end of the operational amplifier. Depending on the logic state of the received digital-data signal Diy, the digital switching-signal generator generates switching signals to control the analog switches and the conceptual analog multiplexers 111 and 112 inside the switched-capacitor set 110' to determine the switched-capacitor set being in a "subtraction state" or an "addition state". The "subtraction state" of the switched-capacitor set is that the bottom end of its first capacitor connects to the direct current voltage source VR1 and the bottom end of its second capacitor connects to the direct current voltage source VR2. On the other hand, the "addition state" is defined as that the bottom end of the first capacitor Cp connects to the direct current voltage source VR2 and the bottom end of the second capacitor Cn connects to the direct current voltage source VR1.

Figure 12:
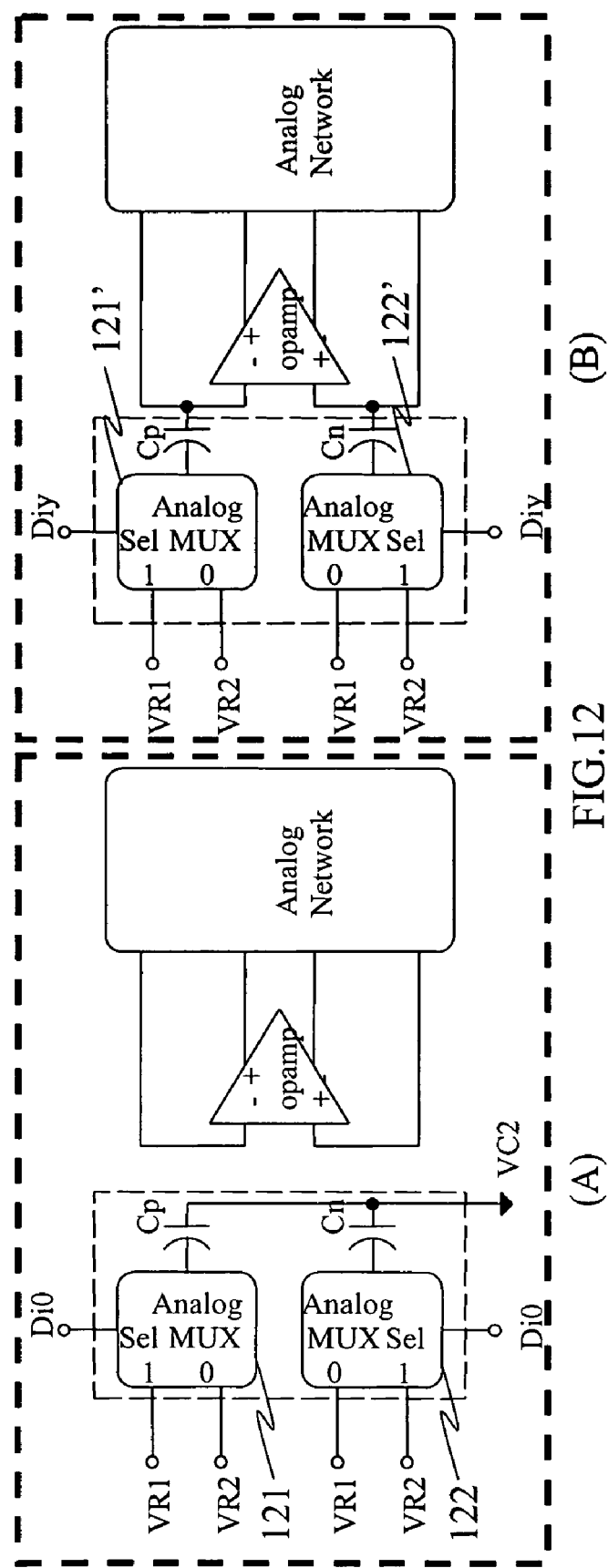
FIG. 12 depicts the operation of the reconfigurable switched-capacitor input circuit in the test mode of the tenth embodiment of the present invention.

Referring to FIG. 12, the test mode operation of the tenth embodiment is provided. In the first clock phase in the test mode illustrated in FIG. 12(A), The digital switching-signal generator receives a corresponding digital stimulus Di0 and generates switching signals to control the analog-signal switches as well as the conceptual analog multiplexers 121 and 122 in the switched-capacitor set. The switched-capacitor set either in an "increased state" or in a "decreased state" is determined by the current logic state of the digital stimulus Di0. In both states, the top ends of the capacitors Cp and Cn connect to a direct current voltage source VC2. When the switched-capacitor set is in the "increased state" the bottom ends of the capacitors Cp and Cn connect to the direct current voltage sources VR1 and VR2 respectively. When the switched-capacitor set is in the "decreased state" the bottom ends of the capacitors Cp and Cn connect to the direct current voltage sources VR2 and VR1 respectively.

In the second clock phase shown in FIG. 12(B), the top ends of the first capacitor Cp and second capacitor Cn connect respectively to the negative and positive input ends of the operational amplifier. The digital switching-signal generator receives the digital-data signal Diy and generates switching signals to control the analog-signal switches as well as the conceptual analog multiplexers 121' and 122' inside the switched-capacitor set. A "subtraction state" or an "addition state" of the switched-capacitor set is varied by the above-mentioned results. The circuit connections of the "subtraction state" are those bottom end of the first capacitor connects to the direct current voltage source VR1 and bottom end of the second capacitor connects to the direct current voltage source VR2; the "addition state" is defined as that the bottom end of the first capacitor connects to the direct current voltage source VR2 and the bottom end of the second capacitor connects to the direct current voltage source VR1. In both states, the top ends of the two capacitors Cp and Cn are connected to the negative input end and the positive input end of the operational amplifier respectively.

As for the tenth embodiment above, the "subtraction state" in the normal mode may match with the "addition state" in the test mode and vice versa. At least one analog-signal switch can be shared by the switched-capacitor sets. The direct current voltage source VC2 may be replaced by the direct current voltage source VR1 or VR2.

For the ten embodiments mentioned above, the operational amplifier may be a part of the circuit under test.

Figure 13:
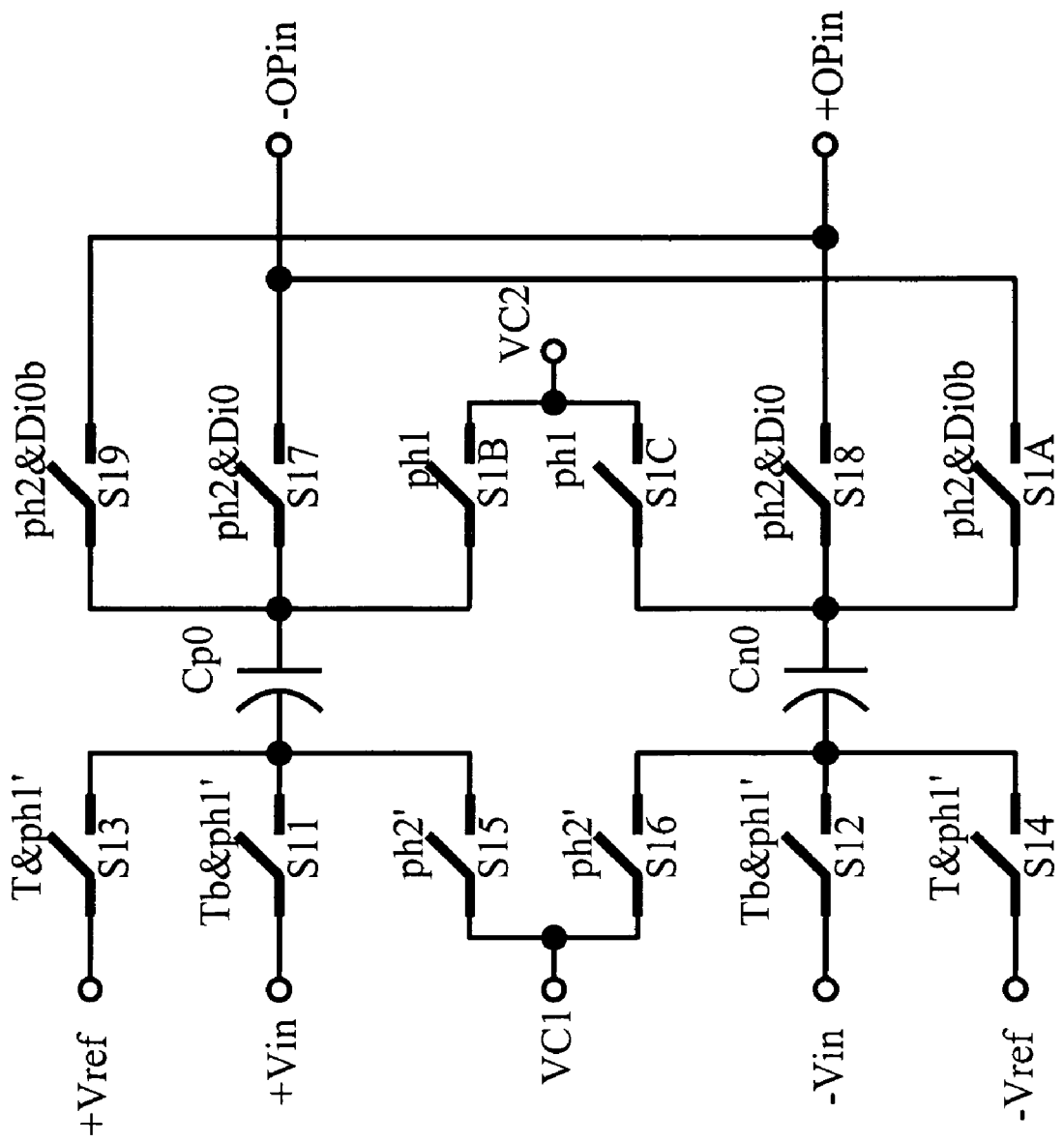
FIG. 13 is a practical circuit implementation of the switched-capacitor set for the third embodiment of the present invention.

What illustrated in FIG. 13 is a practical circuit implementation of the switched-capacitor set described in the third embodiment of the present invention. ph1 and ph2 are the signals used to define the two non-overlapped clock phases. −OPin and +OPin represents the negative input end and the positive input end of the operational amplifier respectively. Every analog-signal switch turns on if its control signal shown in FIG. 13 is logic "1". T is the digital mode signal and Tb is the logic inverse of T. Similarly, Di0 is the digital stimulus and Di0b is the logic inverse of it.

Figure 14:
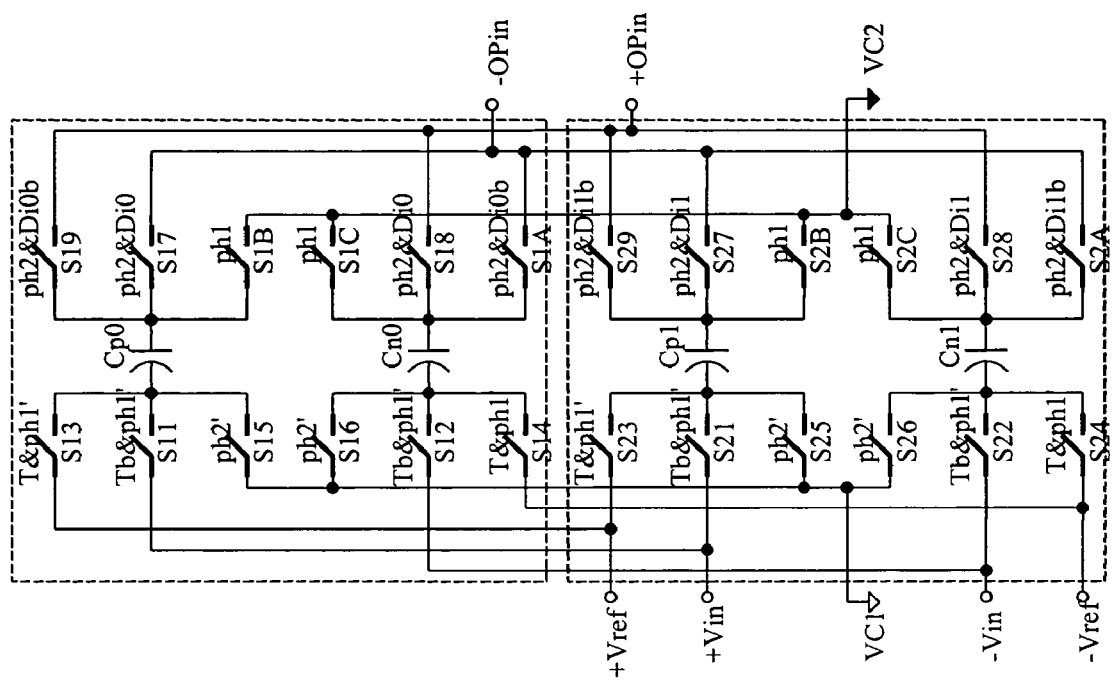
FIG. 14 is a practical circuit implementation exerting two switched-capacitor sets for the third embodiment of the present invention.

In FIG. 14, the circuit implementation of using two switched-capacitor sets applied in the third embodiment of the present invention is provided.

Figure 15:
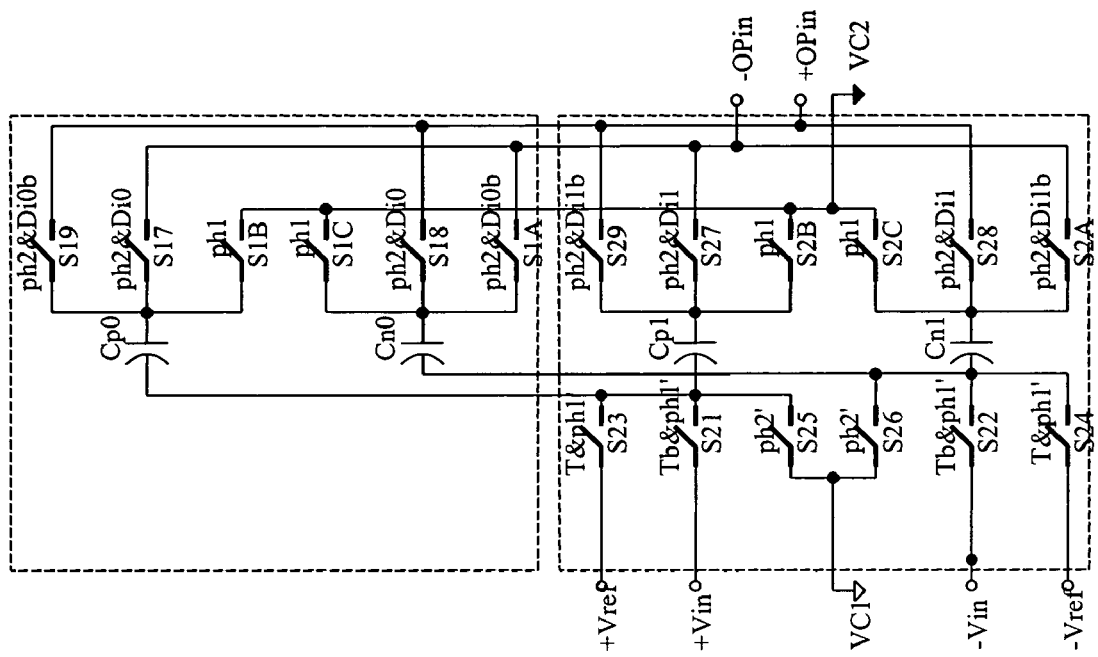
FIG. 15 is a practical circuit implementation exerting two switched-capacitor sets and the switched-capacitor sets sharing several analog switches for the third embodiment of the present invention.

Referring to FIG. 15, the circuit implementation of using two switched-capacitor sets that share several analog-signal switches in the third embodiment of this invention is shown.

Figure 16:
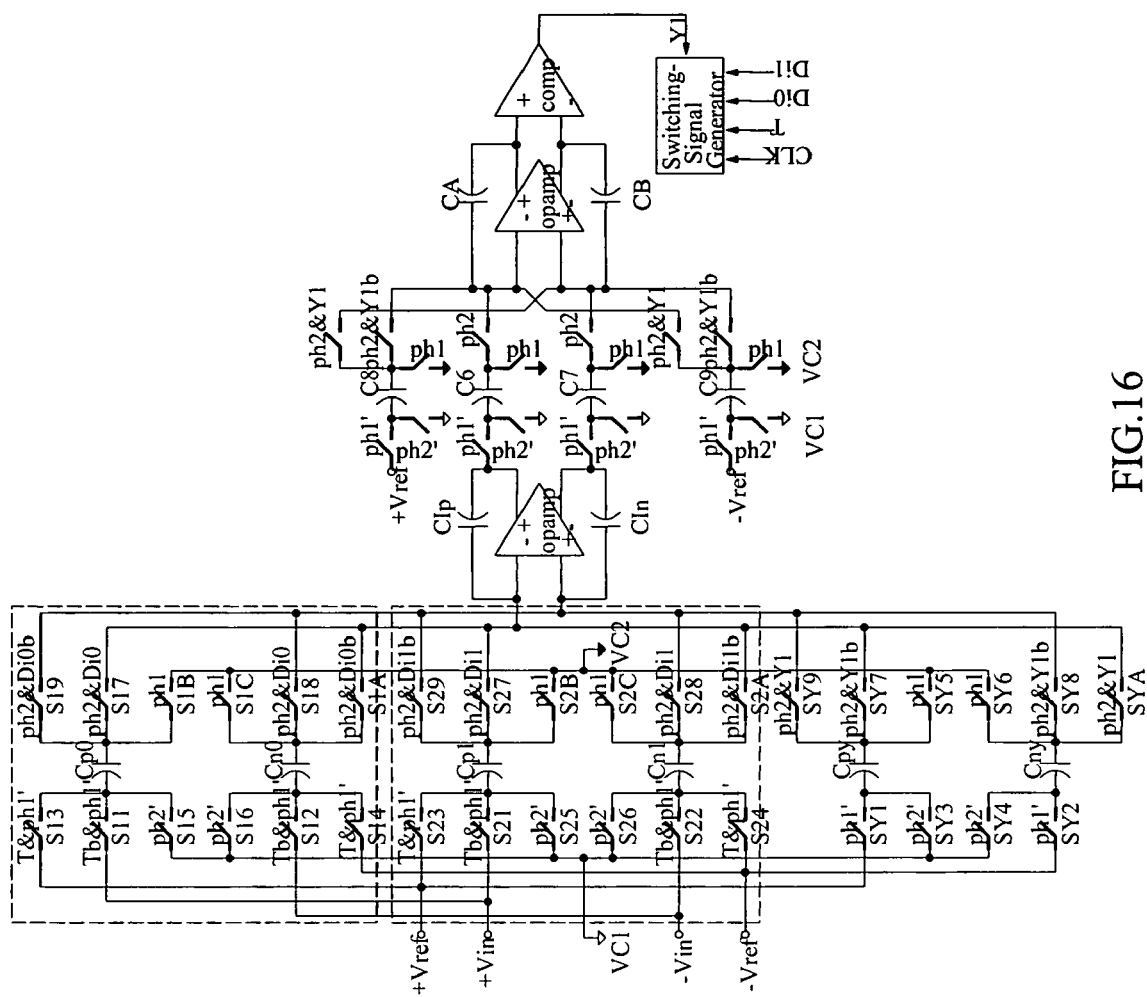
FIG. 16 is a second-order Sigma-Delta modulator example that exerts the third embodiment of the present invention.

Referring to FIG. 16, a circuit schematic of the second-order Sigma-Delta modulator exerting the third embodiment of the present invention is illustrated. The schematic uses two capacitor sets 57 and 58 and is provided with two operation modes including the normal mode and the test mode. When T=0, Tb=1, Di0=1, Di0b=0, Di1=1 and Di1b=0, the circuit is in the normal mode and receives an analog input signal ±Vin. The circuit under this condition is a conventional second-order Sigma-Delta modulator in normal operation. As T=1 and Tb=0, the circuit receives two single-bit digital input stimuli Di0 and Di1 generated by a single-bit software Sigma-Delta modulator. The digital stimuli Di0b and Di1b are the converse logic signals of the Di0 and Di1 respectively. So, the switches S11 to S1C, the capacitors Cp0 and Cn0, the switches S21 to S2C, the capacitors Cp1 and Cn1, and the operational amplifier conceptually comprise two one-bit digital-to-charge converters for producing the test stimuli for the second-order Sigma-Delta modulator. Let the digital stimuli Di0 and Di1 be the same bit-streams with proper delays, the whole circuit under test with the reconfigurable input switched-capacitor circuit is equivalent to having the test stimulus Di0 passing through a finite impulse response low pass filter. According to the above-mentioned, a stimulus more similar to the traditional analog one can be gained for increasing the test accuracy.

Additionally, all the capacitors, operational amplifiers and most of the analog switches are shared in the two operation modes in the present invention, so high measurement accuracy can be achieved. Also, since all the elements are stimulated, high fault coverage can be reached. Moreover, the capacitive loadings of the operational amplifiers in the normal mode are exactly the same with those in the test mode so that this circuit has the capability of performing at-speed tests in the test mode.

The present invention can be put in use of various architectures and orders of the Sigma-Delta modulators. All the analog-signal-receiving input switched-capacitor circuits, which are built in either the single-loop or the cascaded architectures, can be replaced by the present invention. Practically, all the input circuits of any kind of the switched-capacitor circuit may be substituted by the present invention to attain the goal of the low-cost test with pure digital stimuli, which substitutes for the traditional high-priced analog stimuli.

Figure 17:
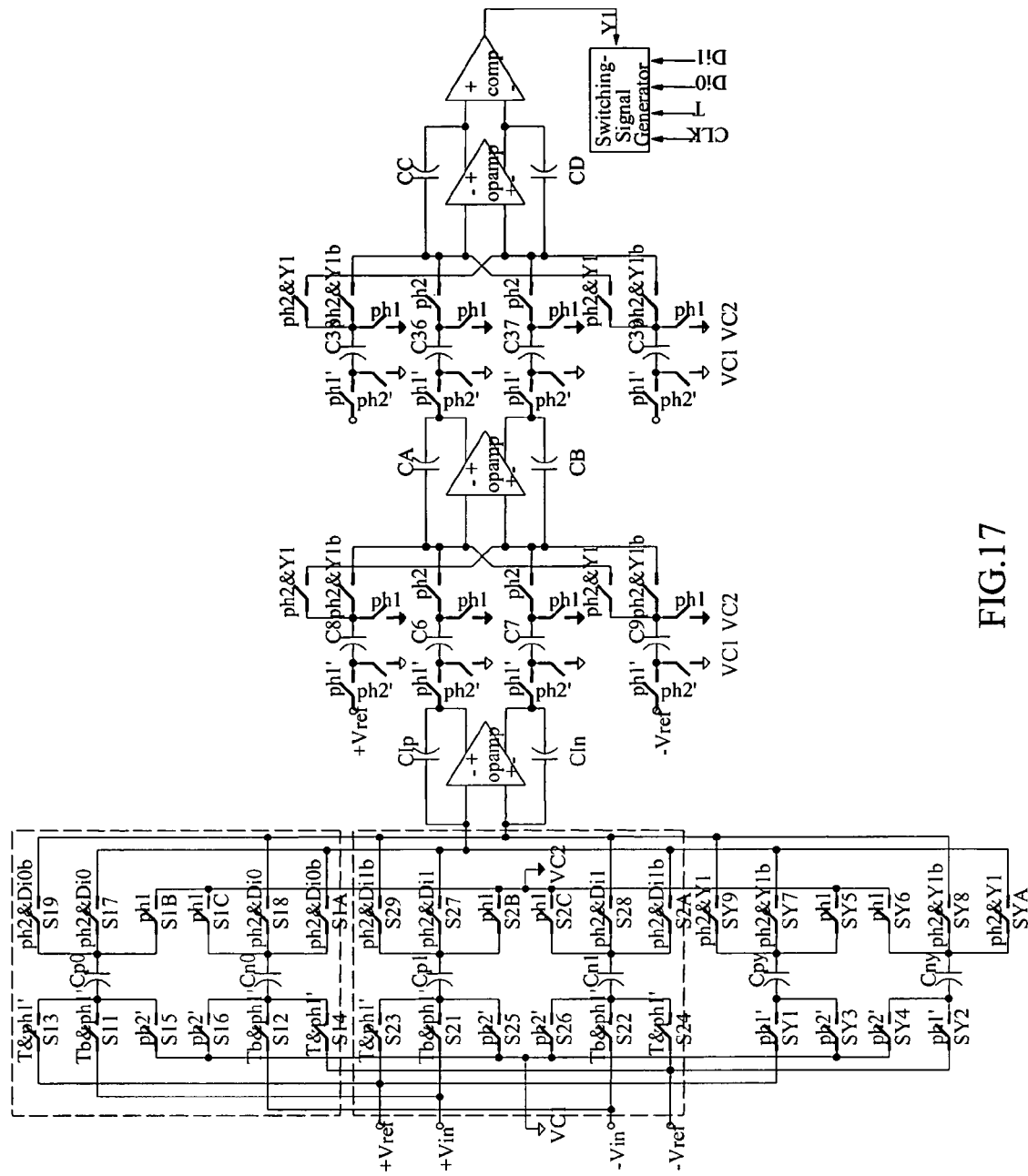
FIG. 17 is a third-order Sigma-Delta modulator example that exerts the third embodiment of the present invention.
Figure 18:
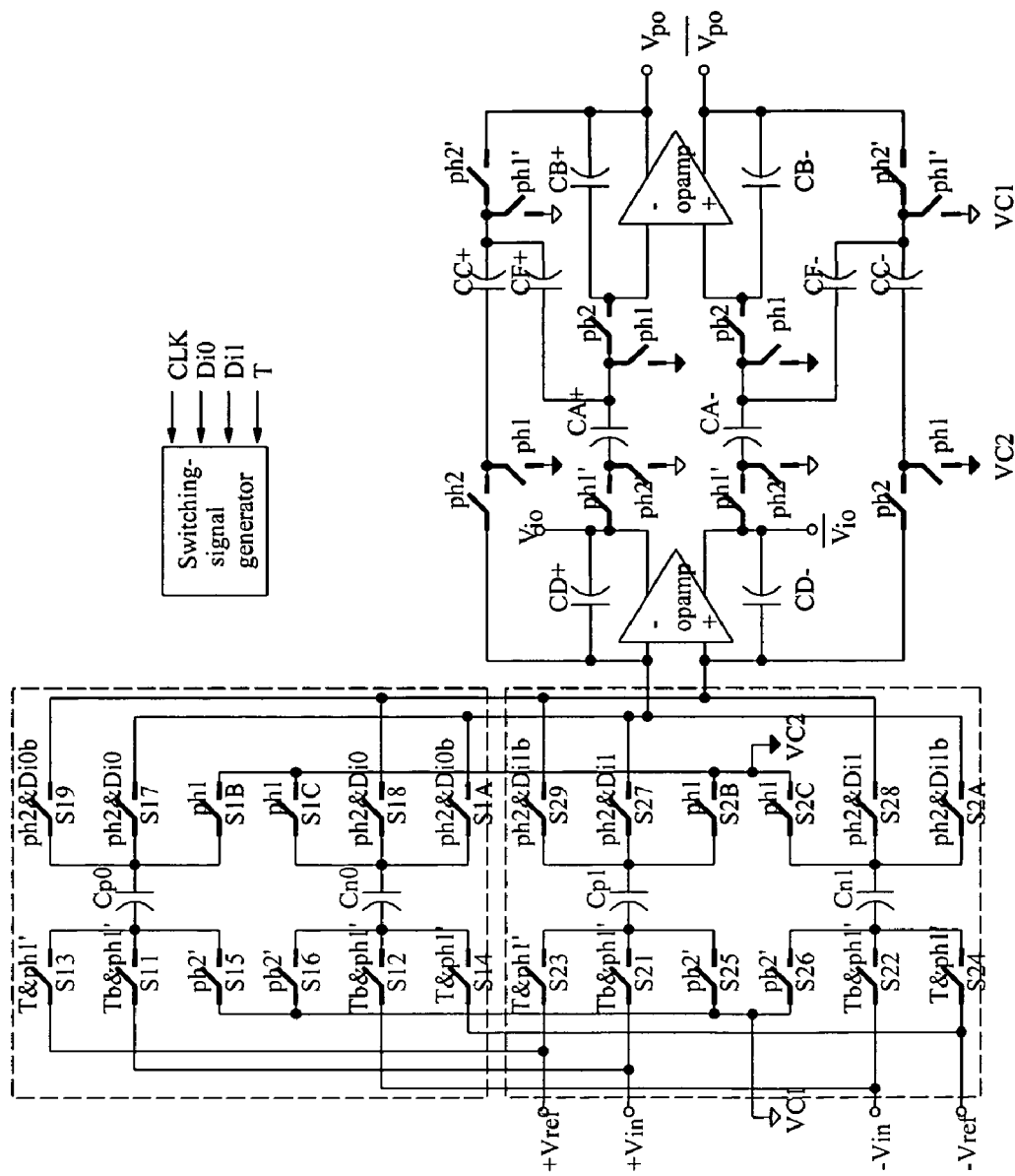
FIG. 18 is a second-order switched-capacitor low pass filter exerting the third embodiment of the present invention.

The circuit connection of a third-order Sigma-Delta modulator is going to be introduced in FIG. 17. It has the same input circuit as the second-order one has. As a result, their operation methods are similar. The application of the present invention in a switched-capacitor low pass filter is illustrated in FIG. 18. Replacing the input circuit of this second-order low pass filter as the present invention to accomplish the target of low-cost test with pure digital stimuli substituting for the high-priced analog stimuli. Coming to the same things as mentioned above, for the operation modes of the switched-capacitor low pass filter, there is no difference from the second-order Sigma-Delta modulator.

In conclusion, the present invention takes the Sigma-Delta modulation as the basis and is suitable for any architecture with switched-capacitor input circuits to make it digitally testable. Via controlling the digital mode signal T, the switched-capacitor circuit under test is determined to operate either in a normal mode or in a test mode. In the normal mode, the circuit receives an analog signal; in the test mode, the input circuit of the switched-capacitor CUT is reconfigured as a digital-test-stimulus-received digital-to-charge converter or more than two ones in parallel so that the high-priced analog stimulus generator may be replaced to reduce the cost of testing.

While the embodiments of the present invention are illustrated and described, various modifications and improvements can be made by persons skilled in the art. The embodiments of the present invention are therefore described in an illustrative but not restrictive sense. It is intended that the present invention may not be limited to the particular forms as illustrated, and that all modifications, which maintain the spirit and realm of the present invention, are within the scope as defined in the appended claims.

What is claimed is:

1. A reconfigurable switched-capacitor input circuit with digital-stimulus acceptability for analog tests, used in the digitally testable architecture of a reconfigurable switched-capacitor input circuit, and comprising:

an analog input signal, including a positive phase voltage signal and a negative phase voltage signal;

multiple DC voltage sources, including: a first DC voltage source, a second DC voltage source, a third DC voltage source, and a fourth DC voltage source;

an operational amplifier, having a first input end, a second input end, a first amplifier output end and a second amplifier output end, and amplifying the voltage difference between said second input end and said first input end to generate an output voltage between said first amplifier output end and said second amplifier output end;

at least two switched-capacitor sets, wherein each said switched-capacitor set further comprises: a first capacitor, a second capacitor and multiple analog-signal switches; each said capacitor has a bottom end and a top end;

a first of said at least two switched-capacitor sets corresponds to a first digital stimulus and a second of said at least two switched-capacitor sets corresponds to a second digital stimulus; and each said first digital stimulus and said second digital stimulus is a Sigma-Delta modulated digital stimulus bit-stream; and a digital switching-signal generator, receiving at least: a digital mode signal, a clock signal, and said first and second digital stimuli, and creating multiple switching signals to control said analog-signal switches of said switched-capacitor sets, wherein said digital mode signal has two logic states, including a normal mode and a test mode, and said clock signal is used to create at least two non-overlapped clock phases, including a first clock phase and a second clock phase; said first switched-capacitor set is controlled by said first digital stimulus and said second switched-capacitor set is controlled by said second digital stimulus and each behaves as one-bit digital-to-charge converter when said digital mode signal is in said test mode state, wherein said second digital stimulus is the same as said first digital stimulus but later than said first digital stimulus by several cycles.

2. The reconfigurable switched-capacitor input circuit according to claim 1, wherein when said digital mode signal is in said test mode, said digital switching-signal generator generates multiple said switching signals to control said analog-signal switches of said switched-capacitor sets in order to enable said reconfigurable switched-capacitor input circuit to operate in said test mode, and the connection of said bottom ends or said top ends of said capacitors of said switched-capacitor sets is switched according to said clock phases; during said first clock phase, said top ends of said capacitors of said switched-capacitor sets are connected to said fourth DC voltage source, and said first digital stimulus controls said first switched-capacitor set and said second digital stimulus controls said second switched-capacitor set in order to determine whether said bottom ends of said capacitors of corresponding said switched-capacitor set is switched to an increased state or a decreased state, and said increased state is that said bottom ends of said first capacitors of said switched-capacitor sets are connected to said first DC voltage source and said bottom ends of said second capacitors of said switched-capacitor sets are connected to said second DC voltage source, and said decreased state is that said bottom ends of said first capacitors of said switched-capacitor sets are connected to said second DC voltage source and said bottom ends of said second capacitors of said switched-capacitor sets are connected to said first DC voltage source; and during said second clock phase, said bottom ends of said capacitors of said switched-capacitor sets are connected to said third DC voltage source, and said top ends of said first capacitors of said switched-capacitor sets are connected to said first input end of said operational amplifier, and said top ends of said second capacitors of said switched-capacitor sets are connected to said second input end of said operational amplifier.

3. The reconfigurable switched-capacitor input circuit according to claim 2, wherein said increased state of said first digital stimulus corresponding to said decreased state of said second digital stimulus, and said decreased state of said first digital stimulus corresponding to said increased state of said second digital stimulus.

4. The reconfigurable switched-capacitor input circuit according to claim 2, wherein said capacitors of said switched-capacitor sets and said operational amplifier are disposed inside a test circuit; when said digital mode signal is in said normal mode, said digital switching-signal generator generates said switching signals to control said analog-signal switches of said switched-capacitor sets in order to enable said reconfigurable switched-capacitor input circuit to operate in said normal mode, and the connection of said bottom ends or said top ends of said capacitors of said switched-capacitor sets is switched according to said clock phases; during said first clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said capacitors of said switched-capacitor sets are connected to said fourth DC voltage source; during said second clock phase, said bottom ends of said capacitors of said switched-capacitor sets are connected to said third DC voltage source, and said top ends of said first capacitors of said switched-capacitor sets are connected to said first input end of said operational amplifier, and said top ends of said second capacitors of said switched-capacitor sets are connected to said second input end of said operational amplifier.

5. The reconfigurable switched-capacitor input circuit according to claim 4, wherein said first clock phase of said normal mode corresponds to said second clock phase of said test mode, and said second clock phase of said normal mode corresponds to said first clock phase of said test mode.

6. The reconfigurable switched-capacitor input circuit according to claim 4, wherein in said normal mode, the connection of said bottom ends or said top ends of said capacitors of said switched-capacitor sets is switched according to said clock phases; during said first clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said first capacitors of said switched-capacitor sets are connected to said first input end of said operational amplifier, and said top ends of said second capacitors of said switched-capacitor sets are connected to said second input end of said operational amplifier; during said second clock phase, said bottom ends of said capacitors of said switched-capacitor sets are connected to said third DC voltage source, and said top ends of said capacitors of said switched-capacitor sets are connected to said fourth DC voltage source.

7. The reconfigurable switched-capacitor input circuit according to claim 6, wherein said first clock phase of said normal mode corresponds to said second clock phase of said test mode, and said second clock phase of said normal mode corresponds to said first clock phase of said test mode.

8. The reconfigurable switched-capacitor input circuit according to claim 4, wherein in said normal mode, the connection of said bottom ends or said top ends of said capacitors of said switched-capacitor sets is switched according to said clock phases; during said first clock phase and said second clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said first capacitors of said switched-capacitor sets are connected to said first input end of said operational amplifier, and said top ends of said second capacitors of said switched-capacitor sets are connected to said second input end of said operational amplifier.

9. The reconfigurable switched-capacitor input circuit according to claim 4, wherein said operational amplifier is disposed inside a test circuit, and said test circuit comprises at least: a first feedback capacitor and a second feedback capacitor; said top end of said first feedback capacitor is connected to said first amplifier output end of said operational amplifier, and the input end of said first feedback capacitor is connected to said first input end of said operational amplifier; said top end of said second feedback capacitor is connected to said second amplifier output end of said operational amplifier, and the input end of said second feedback capacitor is connected to said second input end of said operational amplifier.

10. The reconfigurable switched-capacitor input circuit according to claim 1, wherein said switched-capacitor sets share said multiple analog-signal switches.

11. The reconfigurable switched-capacitor input circuit according to claim 1, wherein said third DC voltage source is said first DC voltage source or said second DC voltage source.

12. The reconfigurable switched-capacitor input circuit according to claim 1, wherein said fourth DC voltage source is said first DC voltage source or said second DC voltage source or said third DC voltage source.

13. The reconfigurable switched-capacitor input circuit according to claim 1, wherein when said digital mode signal is in said test mode, said digital switching-signal generator generates multiple said switching signals to control said analog-signal switches of said switched-capacitor sets in order to enable said reconfigurable switched-capacitor input circuit to operate in said test mode, and the connection of said bottom ends or said top ends of said capacitors of said switched-capacitor sets is switched according to said clock phases; during said first clock phase, said top ends of said capacitors of said switched-capacitor sets are connected to said fourth DC voltage source, and said bottom ends of said first capacitors of said switched-capacitor sets are connected to said first DC voltage source, and said bottom ends of said second capacitors of said switched-capacitor sets are connected to said second DC voltage source; during said second clock phase, said bottom ends of said capacitors of said switched-capacitor sets are connected to said third DC voltage source, said first digital stimulus controls said first switched-capacitor set and said second digital stimulus controls said second switched-capacitor set in order to determine whether said top ends of said capacitors of corresponding said switched-capacitor set is switched to an increased state or a decreased state; said increased state is that said top ends of said first capacitors of said switched-capacitor sets are connected to said first input end of said operational amplifier and said top ends of said second capacitors of said switched-capacitor sets are connected to said second input end of said operational amplifier, and said decreased state is that said top ends of said first capacitors of said switched-capacitor sets are connected to said second input end of said operational amplifier and said top ends of said second capacitors of said switched-capacitor sets are connected to said first input end of said operational amplifier.

14. The reconfigurable switched-capacitor input circuit according to claim 13, wherein said increased state of said first digital stimulus corresponds to said decreased state of said second digital stimulus, and said decreased state of said first digital stimulus corresponds to said increased state of said second digital stimulus.

15. The reconfigurable switched-capacitor input circuit according to claim 13, wherein said capacitors of said switched-capacitor sets and said operational amplifier are disposed inside a test circuit; when said digital mode signal is in said normal mode, said digital switching-signal generator generate multiple said switching signals to control said analog-signal switches of said switched-capacitor sets in order to enable said reconfigurable switched-capacitor input circuit to operate in said normal mode, and the connection of said bottom ends or said top ends of said capacitors of said switched-capacitor sets is switched according to said clock phases; during said first clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said capacitors of said switched-capacitor sets are connected to said fourth DC voltage source; during said second clock phase, said bottom ends of said capacitors of said switched-capacitor sets are connected to said third DC voltage source, and said top ends of said first capacitors of said switched-capacitor sets are connected to said first input end of said operational amplifier, and said top ends of said second capacitors of said switched-capacitor sets are connected to said second input end of said operational amplifier.

16. The reconfigurable switched-capacitor input circuit according to claim 15, wherein said first clock phase of said normal mode corresponds to said second clock phase of said test mode, and said second clock phase of said normal mode corresponds to said first clock phase of said test mode.

17. The reconfigurable switched-capacitor input circuit according to claim 15, wherein in said normal mode, the connection of said bottom ends or said top ends of said capacitors of said switched-capacitor sets is switched according to said clock phases; during said first clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said first capacitors of said switched-capacitor sets are connected to said first input end of said operational amplifier, and said top ends of said second capacitors of said switched-capacitor sets are connected to s said second input end of said operational amplifier; during said second clock phase, said bottom ends of said capacitors of said switched-capacitor sets are connected to said third DC voltage source, and said top ends of said capacitors of said switched-capacitor sets are connected to said fourth DC voltage source.

18. The reconfigurable switched-capacitor input circuit according to claim 17, wherein said first clock phase of said normal mode corresponds to said second clock phase of said test mode, and said second clock phase of said normal mode corresponds to said first clock phase of said test mode.

19. The reconfigurable switched-capacitor input circuit according to claim 15, wherein in said normal mode, the connection of said bottom ends or said top ends of said capacitors of said switched-capacitor sets is switched according to said clock phases; during said first clock phase and said second clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said first capacitors of said switched-capacitor sets are connected to said first input end of said operational amplifier, and said top ends of said second capacitors of said switched-capacitor sets are connected to said second input end of said operational amplifier.

20. The reconfigurable switched-capacitor input circuit according to claim 15, wherein said operational amplifier is disposed inside a test circuit, and said test circuit comprises at least: a first feedback capacitor and a second feedback capacitor; said top end of said first feedback capacitor is connected to said first amplifier output end of said operational amplifier, and the input end of said first feedback capacitor is connected to said first input end of said operational amplifier; said top end of said second feedback capacitor is connected to said second amplifier output end of said operational amplifier, and the input end of said second feedback capacitor is connected to said second input end of said operational amplifier.

21. The reconfigurable switched-capacitor input circuit according to claim 1, wherein said third DC voltage source is said fourth DC voltage source, and said digital switching-signal generator receives said digital mode signal, said clock signal, and said digital stimuli and a digital data signal and generates multiple said switching signals to control said analog-signal switches of said switched-capacitor sets; when said digital mode signal is in said test mode, said digital switching-signal generator generates multiple said switching signals to control said analog-signal switches of said switched-capacitor sets in order to enable said reconfigurable switched-capacitor input circuit to operate in said test mode, and the connection of said bottom ends or said top ends of said capacitors of each said switched-capacitor set is switched according to said clock phases; during said first clock phase, said top ends of said capacitors of said switched-capacitor sets are connected to said fourth DC voltage source, and said first digital stimulus controls said first switched-capacitor set and said second digital stimulus controls said second switched-capacitor set in order to determine whether said bottom ends of said capacitors of corresponding said switched-capacitor set is switched to an increased state or a decreased state, and said increased state is that said bottom ends of said first capacitors of said switched-capacitor sets are connected to said first DC voltage source and said bottom ends of said second capacitors of said switched-capacitor sets are connected to said second DC voltage source, and said decreased state is that said bottom ends of said first capacitors of said switched-capacitor sets are connected to said second DC voltage source and said bottom ends of said second capacitors of said switched-capacitor sets are connected to said first DC voltage source; during said second clock phase, said top ends of said first capacitors of said switched-capacitor sets are connected to said first input end of said operational amplifier, and said top ends of said second capacitors of said switched-capacitor sets are connected to said second input end of said operational amplifier, and said digital data signal controls said first switched-capacitor set and said second switched-capacitor set in order to determine whether said bottom ends of said capacitors of said switched-capacitor sets is switched to a subtraction state or an addition state, and said subtraction state is that said bottom ends of said first capacitors of said switched-capacitor sets are connected to said first DC voltage source and said bottom ends of said second capacitors of said switched-capacitor sets are connected to said second DC voltage source, and said addition state is that said bottom ends of said first capacitors of said switched-capacitor sets are connected to said second DC voltage source and said bottom ends of said second capacitors of said switched-capacitor sets are connected to said first DC voltage source.

22. The reconfigurable switched-capacitor input circuit according to claim 21, wherein said increased state of said first digital stimulus corresponding to said decreased state of said second digital stimulus, and said decreased state of said first digital stimulus corresponding to said increased state of said second digital stimulus.

23. The reconfigurable switched-capacitor input circuit according to claim 21, wherein said capacitors of said switched-capacitor sets and said operational amplifier are disposed inside a test circuit; when said digital mode signal is in said normal mode, said digital switching-signal generator generates said switching signals to control said analog-signal switches of said switched-capacitor sets in order to enable said reconfigurable switched-capacitor input circuit to operate in said normal mode, and the connection of said bottom ends or said top ends of said capacitors of each said switched-capacitor set is switched according to said clock phases; during said first clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said capacitors of said switched-capacitor sets are connected to said fourth DC voltage source; during said second clock phase, said top ends of said first capacitors of said switched-capacitor sets are connected to said first input end of said operational amplifier, and said top ends of said second capacitors of said switched-capacitor sets are connected to said second input end of said operational amplifier, and said digital data signal controls said first switched-capacitor set and said second switched-capacitor set in order to determine whether said bottom ends of said capacitors of corresponding said switched-capacitor set is switched to a subtraction state or an addition state, and said subtraction state is that said bottom ends of said first capacitors of said switched-capacitor sets are connected to said first DC voltage source and said bottom ends of said second capacitors of said switched-capacitor sets are connected to said second DC voltage source, and said addition state is that said bottom ends of said first capacitors of said switched-capacitor sets are connected to said second DC voltage source and said bottom ends of said second capacitors of said switched-capacitor sets are connected to said first DC voltage source.

24. The reconfigurable switched-capacitor input circuit according to claim 23, wherein said subtraction state of said normal mode corresponds to said addition state of said test mode, and said addition state corresponds to said subtraction state of said test mode.

25. The reconfigurable switched-capacitor input circuit according to claim 23, wherein in said normal mode, the connection of said bottom ends or said top ends of said capacitors of said switched-capacitor sets is switched according to said clock phases; during said first clock phase and said second clock phase, said bottom ends of said first capacitors of said switched-capacitor sets are connected to said positive phase voltage of said analog input signal, and said bottom ends of said second capacitors of said switched-capacitor sets are connected to said negative phase voltage of said analog input signal, and said top ends of said first capacitors of said switched-capacitor sets are connected to said first input end of said operational amplifier, and said top ends of said second capacitors of said switched-capacitor sets are connected to said second input end of said operational amplifier.

26. The reconfigurable switched-capacitor input circuit according to claim 23, wherein said operational amplifier is disposed inside a test circuit, and said test circuit comprises at least: a first feedback capacitor and a second feedback capacitor; said top end of said first feedback capacitor is connected to said first amplifier output end of said operational amplifier, and the input end of said first feedback capacitor is connected to said first input end of said operational amplifier, and said top end of said second feedback capacitor is connected to said second amplifier output end of said operational amplifier, and the input end of said second feedback capacitor is connected to said second input end of said operational amplifier.

27. A reconfigurable switched-capacitor input circuit with digital-stimulus acceptability for analog tests, used in the digitally testable architecture of a reconfigurable switched-capacitor input circuit, and comprising:

an analog input signal, including a positive phase voltage signal and a negative phase voltage signal;

multiple DC voltage sources, including: a first DC voltage source, a second DC voltage source, and a third DC voltage source;

an operational amplifier, having a first input end, a second input end, a first amplifier output end and a second amplifier output end, and amplifying the voltage difference between said second input end and said first input end to generate an output voltage between said first amplifier output end and said second amplifier output end;

at least one switched-capacitor set, wherein said switched-capacitor set further comprises: a first capacitor, a second capacitor and multiple analog-signal switches; each of said first capacitor and said second capacitor has a bottom end and a top end; said switched-capacitor set corresponds to a digital stimulus; and said digital stimulus is a Sigma-Delta modulated digital stimulus bit-stream; and a digital switching-signal generator, receiving at least: a digital mode signal, a clock signal, and said digital stimulus, and creating multiple switching signals to control said analog-signal switches of said switched-capacitor set, wherein said digital mode signal has two logic states, including a normal mode and a test mode, and said clock signal is used to create at least two non-overlapped clock phases, including a first clock phase and a second clock phase; each of said switched-capacitor set is controlled by its said corresponding digital stimulus and behaves as a one-bit digital-to-charge converter when said digital mode signal is in said test mode state;

wherein when said digital mode signal is in said test mode, said digital switching-signal generator generates multiple said switching signals to control said analog-signal switches of said switched-capacitor set in order to enable said reconfigurable switched-capacitor input circuit to operate in said test mode, and the connection of said bottom ends and said top ends of said capacitors of said switched-capacitor set is switched according to said clock phases; during said first clock phase, said bottom end of said first capacitor is connected to said first DC voltage source, and said bottom end of said second capacitor is connected to said second DC voltage source, and said top ends of said capacitors of said switched-capacitor set are connected to said third DC voltage source; during said second clock phase, said bottom end of said first capacitor is connected to said second DC voltage source, and said bottom end of said second capacitor is connected to said first DC voltage source, and said digital stimulus controls corresponding said switched-capacitor set in order to determine whether the connection of said top ends of said capacitors of said corresponding switched-capacitor set is switched to an increased state or a decreased state, and said increased state is that said top end of said first capacitor is connected to said first input end of said operational amplifier and said top end of said second capacitor is connected to said second input end of said operational amplifier, and said decreased state is that said top end of said first capacitor is connected to said second input end of said operational amplifier and said top end of said second capacitor is connected to said first input end of said operational amplifier.

28. The reconfigurable switched-capacitor input circuit according to claim 27, wherein said capacitors of said switched-capacitor set and said operational amplifier are disposed inside a test circuit; when said digital mode signal is in said normal mode, said digital switching-signal generator generates said switching signals to control said analog-signal switches of said switched-capacitor set in order to enable said reconfigurable switched-capacitor input circuit to operate in said normal mode, and the connection of said bottom ends and said top ends of said capacitors of said switched-capacitor set is switched according to said clock phases; during said first clock phase, said bottom end of said first capacitor of said switched-capacitor set is connected to said positive phase voltage of said analog input signal, and said bottom end of said second capacitor of said switched-capacitor set is connected to said negative phase voltage of said analog input signal, and said top ends of said capacitors of said switched-capacitor set are connected to said third DC voltage source; during said second clock phase, said bottom ends of said capacitors of said switched-capacitor set are connected to said second DC voltage source, and said top end of said first capacitor is connected to said first input end of said operational amplifier, and said top end of said second capacitor is connected to said second input end of said operational amplifier.

29. The reconfigurable switched-capacitor input circuit according to claim 28, wherein said first clock phase of said normal mode corresponds to said second clock phase of said test mode, and said second clock phase of said normal mode corresponds to said first clock phase of said test mode.

30. The reconfigurable switched-capacitor input circuit according to claim 27, wherein in said normal mode, the connection of said bottom ends or said top ends of said capacitors of said switched-capacitor set is switched according to said two non-overlapped clock phases generated by said clock signal; during said first clock phase, said bottom end of said first capacitor is connected to said positive phase voltage of said analog input signal, and said bottom end of said second capacitor is connected to said negative phase voltage of said analog input signal, and said top end of said first capacitor is connected to said first input end of said operational amplifier, and said top end of said second capacitor is connected to said second input end of said operational amplifier; and during said second clock phase, said bottom ends of said capacitors of said switched-capacitor set are connected to said second DC voltage source, and said top ends of said capacitors of said switched-capacitor set are connected to said third DC voltage source.

31. The reconfigurable switched-capacitor input circuit according to claim 30, wherein said first clock phase of said normal mode corresponds to said second clock phase of said test mode, and said second clock phase of said normal mode corresponds to said first clock phase of said test mode.

32. The configurable switched-capacitor input circuit according to claim 27, which comprises at least a first switched-capacitor set and second switched-capacitor set respectively corresponding to at least first digital stimulus and a second digital stimulus, wherein said second digital stimulus is the same as said first digital stimulus but later than said first digital stimulus by several cycles.

33. The reconfigurable switched-capacitor input circuit according to claim 32, wherein said switched-capacitor sets share said multiple analog-signal switches.

34. The reconfigurable switched-capacitor input circuit according to claim 33, wherein said third DC voltage source is said first DC voltage source or said second DC voltage source.

35. The reconfigurable switched-capacitor input circuit according to claim 34, wherein said increased state of said first digital stimulus corresponds to said decreased state of said second digital stimulus, and said decreased state of said first digital stimulus corresponds to said increased state of said second digital stimulus.

36. The reconfigurable switched-capacitor input circuit according to claim 27, wherein said operational amplifier is disposed inside a test circuit, and said test circuit comprises at least: a first feedback capacitor and a second feedback capacitor; said top end of said first feedback capacitor is connected to said first amplifier output end of said operational amplifier, and the input end of said first feedback capacitor is connected to said first input end of said operational amplifier, and said top end of said second feedback capacitor is connected to said second amplifier output end of said operational amplifier, and the input end of said second feedback capacitor is connected to said second input end of said operational amplifier.

37. The reconfigurable switched-capacitor input circuit according to claim 27, wherein when said digital mode signal is in said test mode, said digital switching-signal generator generates multiple said switching signals to control said analog-signal switches of said switched-capacitor set in order to enable said reconfigurable switched-capacitor input circuit to operate in said test mode, and in said test mode, the connection of said bottom ends and said top ends of said capacitors of said switched-capacitor set is switched according to said clock phases; during said first clock phase, said top end of said first capacitor is connected to said third DC voltage source, and said top end of said second capacitor is connected to said third DC voltage source, and said digital stimulus controls corresponding said switched-capacitor set in order to determine whether said bottom ends of said capacitors of said switched-capacitor set is switched to an increased state or a decreased state, and said increased state is that said bottom end of said first capacitor is connected to said first DC voltage source and said bottom end of said second capacitor is connected to said second DC voltage source, and said decreased state is that said bottom end of said first capacitor is connected to said second DC voltage source and said bottom end of said second capacitor is connected to said first DC voltage source; during said second clock phase, said bottom end of said first capacitor is connected to said second DC voltage source, and said top end of said first capacitor is connected to said first input end of said operational amplifier, and said bottom end of said second capacitor is connected to said second DC voltage source, and said top end of said second capacitor is connected to said second input end of said operational amplifier.

38. The reconfigurable switched-capacitor input circuit according to claim 37, wherein said capacitors of said switched-capacitor set and said operational amplifier are disposed inside a test circuit; when said digital mode signal is in said normal mode, said digital switching-signal generator generates said switching signals to control said analog-signal switches of said switched-capacitor set in order to enable said reconfigurable switched-capacitor input circuit to operate in said normal mode, and the connection of said bottom ends and said top ends of said capacitors of said switched-capacitor set is switched according to said clock phases; during said first clock phase, said bottom end of said first capacitor is connected to said positive phase voltage of said analog input signal, and said bottom end of said second capacitor is connected to said negative phase voltage of said analog input signal, and said top ends of said capacitors of said switched-capacitor set are connected to said third DC voltage source; during said second clock phase, said bottom ends of said capacitors of said switched-capacitor set are connected to said second DC voltage source, and said top end of said first capacitor is connected to said first input end of said operational amplifier, and said top end of said second capacitor is connected to said second input end of said operational amplifier.

39. The reconfigurable switched-capacitor input circuit according to claim 38, wherein said first clock phase of said normal mode corresponds to said second clock phase of said test mode, and said second clock phase of said normal mode corresponds to said first clock phase of said test mode.

40. The reconfigurable switched-capacitor input circuit according to claim 37, wherein in said normal mode, the connection of said bottom ends or said top ends of said capacitors of said switched-capacitor set is switched according to said two non-overlapped clock phases created by said clock signal; during said first clock phase, said bottom end of said first capacitor is connected to said positive phase voltage of said analog input signal, and said bottom end of said second capacitor is connected to said negative phase voltage of said analog input signal, and said top end of said first capacitor is connected to said first input end of said operational amplifier, and said top end of said second capacitor is connected to said second input end of said operational amplifier; during said second clock phase, said bottom ends of said capacitors of said switched-capacitor set are connected to said second DC voltage source, and said top ends of said capacitors of said switched-capacitor set are connected to said third DC voltage source.

41. The reconfigurable switched-capacitor input circuit according to claim 40, wherein said first clock phase of said normal mode corresponds to said second clock phase of said test mode, and said second clock phase of said normal mode corresponds to said first clock phase of said test mode.

42. The reconfigurable switched-capacitor input circuit according to claim 37, wherein said operational amplifier is disposed inside a test circuit, and said test circuit comprises at least: a first feedback capacitor and a second feedback capacitor; said top end of said first feedback capacitor is connected to said first amplifier output end of said operational amplifier, and the input end of said first feedback capacitor is connected to said first input end of said operational amplifier; said top end of said second feedback capacitor is connected to said second amplifier output end of said operational amplifier, and the input end of said second feedback capacitor is connected to said second input end of said operational amplifier.

43. A reconfigurable switched-capacitor input circuit with digital-stimulus acceptability for analog tests, used in the digitally testable architecture of a reconfigurable switched-capacitor input circuit, and comprising:

an analog input signal, including a positive phase voltage signal and a negative phase voltage signal;

a digital data signal, having two logic states, including an addition state and a subtraction state;

multiple DC voltage sources, including: a first DC voltage source, a second DC voltage source, and a third DC voltage source;

an operational amplifier, having a first input end, a second input end, a first amplifier output end and a second amplifier output end, and amplifying the voltage difference between said second input end and said first input end to generate an output voltage between said first amplifier output end and said second amplifier output end;

at least one switched-capacitor set, wherein said switched-capacitor set further comprises: a first capacitor, a second capacitor and multiple analog-signal switches; each of said first capacitor and said second capacitor has a bottom end and a top end; said switched-capacitor set corresponds to a digital stimulus; and said digital stimulus is a Sigma-Delta modulated digital stimulus bit-stream; and a digital switching-signal generator, receiving at least: a digital mode signal, said digital data signal, a clock signal, and said digital stimulus, and creating multiple switching signals to control said analog-signal switches of said switched-capacitor set, wherein said digital mode signal has two logic states, including a normal mode and a test mode, and said clock signal is used to create at least two non-overlapped clock phases, including a first clock phase and a second clock phase; each of said switched-capacitor set is controlled by its said corresponding digital stimulus and behaves as a one-bit digital-to-charge converter when said digital mode signal is in said test mode state;

wherein when said digital mode signal is in said test mode, said digital switching-signal generator generates multiple said switching signals to control said analog-signal switches of said switched-capacitor set in order to enable said reconfigurable switched-capacitor input circuit to operate in said test mode, and in said test mode, the connection of said bottom ends and said top ends of said capacitors of said switched-capacitor set is switched according to said clock phases; during said first clock phase, said top ends of said capacitors of said switched-capacitor set are connected to said third DC voltage source, and said digital stimulus controls the connection of said bottom ends of said first capacitor and said second capacitor in order to determine whether said bottom ends of said capacitors are switched to an increased state or a decreased state, and said increased state is that said bottom end of said first capacitor is connected to said first DC voltage source and said bottom end of said second capacitor is connected to said second DC voltage source, and said decreased state is that said bottom end of said first capacitor is connected to said second DC voltage source and said bottom end of said second capacitor is connected to said first DC voltage source; during said second clock phase, and said top end of said first capacitor is connected to said first input end of said operational amplifier, and said top end of said second capacitor is connected to said second input end of said operational amplifier, and said digital data signal controls said switched-capacitor set in order to determine whether the connection of said bottom ends of said capacitors of said switched-capacitor set is switched to said subtraction state or said addition state, and said subtraction state is that said bottom end of said first capacitor is connected to said first DC voltage source and said bottom end of said second capacitor is connected to said second DC voltage source, and said addition state is that said bottom end of said first capacitor is connected to said second DC voltage source and said bottom end of said second capacitor is connected to said first DC voltage source.

44. The reconfigurable switched-capacitor input circuit according to claim 43, wherein said capacitors of said switched-capacitor set and said operational amplifier are disposed inside a test circuit; when said digital mode signal is in said normal mode, said digital switching-signal generator generates said switching signals to control said analog-signal switches of said switched-capacitor set in order to enable said reconfigurable switched-capacitor input circuit to operate in said normal mode, and the connection of said bottom ends and said top ends of said capacitors of said switched-capacitor set is switched according to said clock phases; during said first clock phase, said bottom end of said first capacitor is connected to said positive phase voltage of said analog input signal, and said bottom end of said second capacitor is connected to said negative phase voltage of said analog input signal, and said top ends of said capacitors of said switched-capacitor set are connected to said third DC voltage source; during said second clock phase, said top end of said first capacitor is connected to said first input end of said operational amplifier, and said top end of said second capacitor is connected to said second input end of said operational amplifier, and said digital data signal controls said switched-capacitor set in order to determine whether the connection of said bottom ends of said capacitors of said switched-capacitor set is switched to said subtraction state or said addition state, and said subtraction state is that said bottom end of said first capacitor is connected to said first DC voltage source and said bottom end of said second capacitor is connected to said second DC voltage source, and said addition state is that said bottom end of said first capacitor is connected to said second DC voltage source and said bottom end of said second capacitor is connected to said first DC voltage source.

45. The reconfigurable switched-capacitor input circuit according to claim 44, wherein said subtraction state of said normal mode corresponds to said addition state of said test mode, and said addition state of said normal mode corresponds to said subtraction state of said test mode.

46. The configurable switched-capacitor input circuit according to claim 43, which comprises at least a first switched-capacitor set and second switched-capacitor set respectively corresponding to at least first digital stimulus and a second digital stimulus, wherein said second digital stimulus is the same as said first digital stimulus but later than said first digital stimulus by several cycles.

47. The reconfigurable switched-capacitor input circuit according to claim 46, wherein said switched-capacitor sets share said multiple analog-signal switches.

48. The reconfigurable switched-capacitor input circuit according to claim 47, which said increased state of said first digital stimulus corresponds to said decreased state of said second digital stimulus, and said decrease state of said first digital stimulus corresponds to said increased state of said second digital stimulus.

49. The reconfigurable switched-capacitor input circuit according to claim 43, which said third DC voltage source is said first DC voltage source or said second DC voltage source.

* * * * *